(12) United States Patent
Courtade et al.

(10) Patent No.: US 7,960,775 B2
(45) Date of Patent: Jun. 14, 2011

(54) METHOD FOR MANUFACTURING A MEMORY ELEMENT COMPRISING A RESISTIVITY-SWITCHING NIO LAYER AND DEVICES OBTAINED THEREOF

(75) Inventors: Lorene Courtade, La Garde (FR); Judit Lisoni Reyes, Oud-Heverlee (BE); Ludovic Goux, Hannut (BE); Christian Turquat, La Valette du Var (FR); Christophe Muller, Toulon (FR); Dirk Wouters, Leuven (BE)

(73) Assignees: IMEC, Leuven (BE); University of South Toulon VAR, La Garde Cedex (FR)

( * ) Notice: Subject to any disclaimer, the term of this patent is extended or adjusted under 35 U.S.C. 154(b) by 39 days.

(21) Appl. No.: 12/267,427

(22) Filed: Nov. 7, 2008

(65) Prior Publication Data

US 2009/0152526 A1    Jun. 18, 2009

Related U.S. Application Data

(60) Provisional application No. 60/986,138, filed on Nov. 7, 2007.

(30) Foreign Application Priority Data

Nov. 7, 2007    (JP) ................................ 2007-289715

(51) Int. Cl.
*H01L 27/108* (2006.01)
*H01L 21/8234* (2006.01)
(52) U.S. Cl. ......... 257/312; 438/238; 438/382; 365/148
(58) Field of Classification Search .................. 438/238, 438/330, 382, 385; 257/312; 365/148
See application file for complete search history.

(56) References Cited

U.S. PATENT DOCUMENTS

2009/0273964 A1* 11/2009 Yamazaki et al. ............ 365/148

FOREIGN PATENT DOCUMENTS

| WO | 2006/121837 | 11/2006 |
| WO | 2007/062014 | 5/2007 |

OTHER PUBLICATIONS

Kim, D.C. et al., "Electrical observations of filamentary conductions for the resistive memory switching in NiO films," Applied Physics Letter, 88(20), 202102 (2006).
Baek, G. et al., "Highly Scalable Non-volatile Resistive Memory using Simple Binary Oxide Driven by Asymmetric Unipolar Voltage Pulses," International Electron Devices Meeting Tech. Dig., p. 587 (2004).

(Continued)

*Primary Examiner* — Kevin M Picardat
(74) *Attorney, Agent, or Firm* — McDonnell Boehnen; Hulbert & Berghoff LLP

(57) ABSTRACT

The present disclosure is related to non-volatile memory devices comprising a reversible resistivity-switching layer used for storing data. The resistivity of this layer can be varied between at least two stable resistivity states such that at least one bit can be stored therein. In particular this resistivity-switching layer is a metal oxide or a metal nitride. A resistivity-switching non-volatile memory element includes a resistivity-switching metal-oxide layer sandwiched between a top electrode and a bottom electrode. The resistivity-switching metal-oxide layer has a gradient of oxygen over its thickness. The gradient is formed in a thermal oxidation step. Set and reset voltages can be tuned by using different oxygen gradients.

42 Claims, 40 Drawing Sheets

OTHER PUBLICATIONS

Czerwinski et al., "Controlling the surface texture of nickel for high temperature oxidation inhibition," Corrosion Science, 41:729-740 (1999).

Lopez-Beltran, A.M. et al., "The oxidation kinetics of nickel thin films studied by spectroscopic ellipsometry," Thin Solid Films, 503:40-44 (2006).

Czerwinski et al., "The Influence of Crystallographic Orientation of Nickel Surface on Oxidation Inhibition by Ceria Coatings," Acta mater., 46(4):1403-1417 (1998).

Graham, M.J. et al., "Influence of Oxide Structure on the Oxidation Rate of Nickel Single Crystals," J. Electrochem. Soc., 119:1523-1529 (1973).

Graham, M.J. et al., "On the Mechanism of Low-Temperature Oxidation (23°-450° C.) of Polycrystalline Nickel," J. Electrochem. Soc., 119:879-882 (1972).

Process Integration, Devices and Structures, International Technology Roadmap for Semiconductors, pp. 1-52, 2005 Edition [http://www.itrs.net/Links/2005ITRS/Home2005.htm].

Peraldi et al., "High Temperature oxidation of high purity nickel: oxide scale morphology and growth kinetics," Mat. High Temperatures, 20:649-655 (2003).

Peraldi et al., "Correlations between Growth Kinetics and Microstructure for Scales Formed by High-Temperature Oxidation of Pure Nickel. II. Growth Kinetics," Oxidation of Metals, 58:(3/4):275-295 (2002).

\* cited by examiner

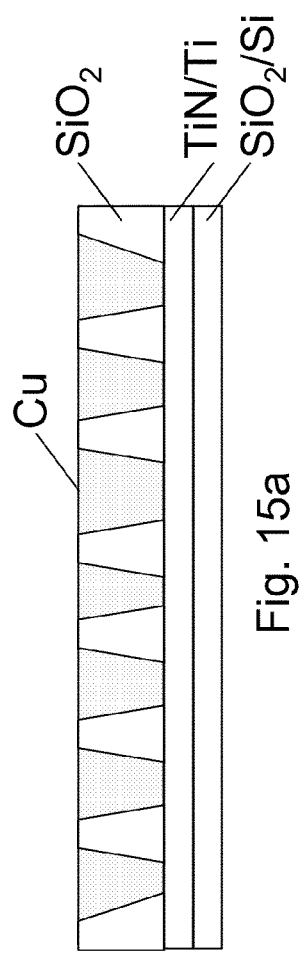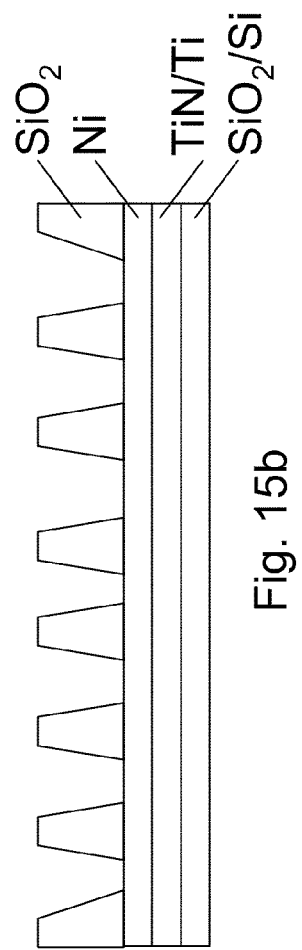

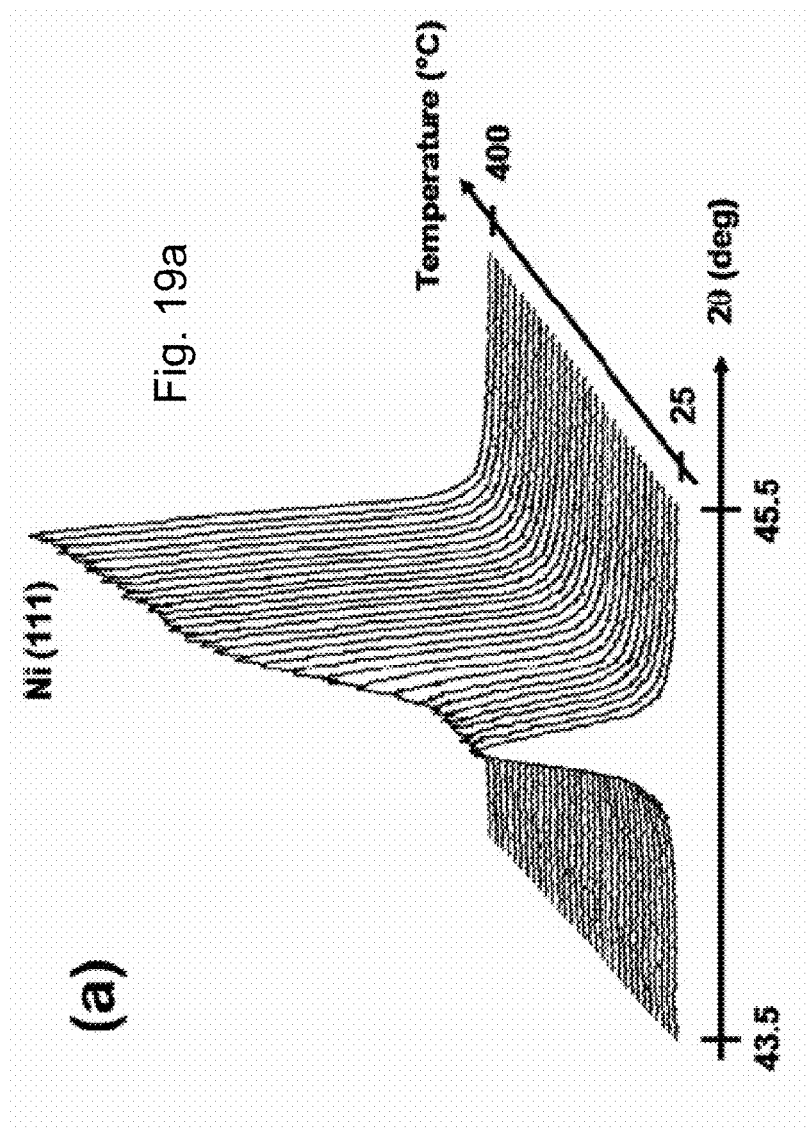

Fig. 26

| Ni thickness | Atmosphere | Annealing temperature | Oxidation time |
|---|---|---|---|
| 100 nm & 24 nm | Pure O₂ | 200°C | 30s, 3 min, 5 min |
| | | 300°C | 30s, 1 min, 2min, 3 min, 5 min |
| | | 400°C | 10s, 20s, 30s, 1 min, 2min, 3 min, 5 min |
| | 500 ppm | 200°C | 30s, 3 min |
| | | 400°C | 30s, 3 min |
| | 20 ppm | 200°C | 30s, 3 min |
| | | 400°C | 30s, 3 min |

Table 1

Fig. 27

| RTA conditions | T (°C) | $D_\infty$ (nm) | k | n |
|---|---|---|---|---|
| | 400 | 19.6 | 8.8 | 0.35 |
| | 400 | 26.5 | 1.0 | 0.41 |
| In situ oxidation | 500 | 32.4 | 1.4 | 0.22 |

Table 2

Fig. 28

Sum up of electrical behavior correlated with the presence of NiO and/or Ni phases checked by X-ray diffraction

| (a) | 200 °C | | 300 °C | | 400 °C | |
|---|---|---|---|---|---|---|
| PO₂: | 30 s | 180 s | 300 s | 30 s | 180 s | 300 s | 30 s | 180 s | 300 s |
| Pure O₂ | NSW | NSW | NSW | SW 3.8 V NiO/Ni | SW 4.3 V NiO/Ni | SW 4.7 V NiO/Ni | SW 4.4 V NiO/Ni | SW 4.6 V NiO/Ni | SW 5.5 V NiO/Ni |
| 500 ppm O₂ | SW 2.8 V NiO/Ni | SW 3.1 V NiO/Ni | Ni | | | | SW 3.3 V NiO/Ni | SW 3.8 V NiO/Ni | |
| 20 ppm O₂ | SW 2.3 V NiO/Ni | SW 2.7 V NiO/Ni | Ni | | | | SW 2.9 V NiO/Ni | SW 3.3 V NiO/Ni | |

| (b) | 200 °C | | 300 °C | | 400 °C | |
|---|---|---|---|---|---|---|
| PO₂: | 30 s | 180 s | 300 s | 30 s | 180 s | 300 s | 30 s | 180 s | 300 s |
| Pure O₂ | SW 3.1 V NiO/Ni | SW 3.2 V NiO/Ni | SW 3.5 V NiO/Ni | SW 3.3 V NiO/Ni | SW 3.7 V NiO/Ni | SW 3.8 V NiO/Ni | NSW | NSW | NSW |
| 500 ppm O₂ | SW 2.8 V NiO/Ni | SW 3.1 V NiO/Ni | | NiO | | | SW 3.2 V NiO/Ni | NiO | NiO |
| 20 ppm O₂ | SW 2.3 V NiO/Ni | SW 2.7 V NiO/Ni | | NiO/Ni | | | SW 2.5 V NiO/Ni | NSW | NiO |

The initial Ni thickness is 100 nm (a) or 24 nm (b) (NSW = no switching; SW = switching; corresponding V_th is given when a resistive switching is observed).

Table 3

METHOD FOR MANUFACTURING A MEMORY ELEMENT COMPRISING A RESISTIVITY-SWITCHING NIO LAYER AND DEVICES OBTAINED THEREOF

BACKGROUND

The present disclosure is related to non-volatile memory devices comprising a reversible resistivity-switching layer used for storing data. The resistivity of this layer can be varied between at least two stable resistivity states such that at least one bit can be stored therein. In particular this resistivity-switching layer is a metal oxide or a metal nitride.

Today the Flash non-volatile memory technology, whereby charge is stored in a conductive or non-conductive charge storage layer incorporated in a MOSFET structure, dominates the market of non-volatile memories. It is expected that this type of non-volatile memory technology will face severe scaling problems beyond the 45 nm technology node due to fundamental physical limitations associated with this data storage mechanism as put forward in the International Technology Roadmap for Semiconductors (ITRS), "2005 edition, Process integration, Devices and Structures".

Other non-volatile memory technologies are emerging that have the potential of allowing further downscaling of the memory cell dimensions. Among the most promising technologies are resistive-switching memories also known as Resistive Random Access Memory (RRAM). Such a RRAM memory cell comprises a memory element and a selection element. The resistivity of the non-volatile memory element can be reversibly varied between at least two stable resistivity states employing a voltage- or current-induced resistivity change of a material. Examples of such reversible resistivity-switching active material are chalcogenides, carbon polymers, selected binary metal oxides such as nickel-oxide, tungsten-oxide, cupper-oxide, ternary metal oxides such as nickel-cobalt-oxide or even more complex metal oxides such as Cr-doped $Sr(Ti)ZrO_3$ or $Pr_{0.7}Ca_{0.3}MnO_3$.

An important criterion to select non-volatile memory technologies for high density levels will be the low-voltage operation of the memory cell. As supply voltages are scaled down, the operation voltages of the memory cell need also to be downscaled. Allowing lower supply voltages for the memory cell will result amongst other things in reduced power consumption, increased battery life, and reduced heating of the integrated circuit. As will be discussed below, the electro-forming process of an OxRRAM memory technology is of particular concern because it requires the application of several volts, typically 4-6V, during long times, typically more than the millisecond range. Regarding the thermal-induced reset mechanism, data retention of the ON state may be poor. Especially when using of nickel-oxide OxRRAM memories in the automotive segment where the memory cell has to function in a high temperature environment, the dependency of the reset mechanism on temperature may shown a weakness of the state-of-the-art nickel oxide OxRRAM memory cell. Hence it would be advantageous to eliminate the need for a "forming process", to reduce the amplitude of the set and reset signals.

SUMMARY

In a first aspect, a resistivity-switching non-volatile memory element is disclosed, comprising a resistivity-switching metal-oxide layer sandwiched between a top electrode and a bottom electrode, and the metal oxide layer having a gradient of oxygen over the layer thickness. The oxygen gradient of the metal oxide layer preferably decreases from the top electrode towards the bottom electrode. The memory element preferably has set and reset voltages of opposite polarity.

The metal-oxide of the memory element can comprise nickel. This nickel-containing metal oxide preferably is a binary nickel-oxide. The bottom electrode of the memory element can comprise nickel. The bottom electrode of the memory element can thus comprise a nickel-containing layer adjacent to the nickel-oxide metal oxide layer, and a titanium-containing layer adjacent to the nickel-containing layer. Preferably the bottom electrode is a stack of a nickel layer adjacent to the nickel-oxide layer, a titanium-nitride layer adjacent to the nickel layer, and a titanium-layer adjacent to titanium-nitride layer. The top electrode and the bottom electrode can be formed of the same material. The top electrode of the memory element can thus comprise nickel. In a preferred embodiment the top electrode, the bottom electrode and the metal oxide layer comprise nickel.

Also a memory cell is disclosed comprising a memory element according to any of the foregoing paragraphs, and a selection element in electrical contact with one of the electrodes. This selection element can be a MOSFET, and one of the source/drain junctions of the MOSFET is electrically connected to one of the electrodes.

In a second aspect, a method for forming a resistivity-switching non-volatile memory element is disclosed, comprising providing a substrate, forming a bottom electrode on the substrate, forming a resistivity-switching metal-oxide layer on the bottom electrode, the metal-oxide layer having an oxygen gradient over the layer thickness, and forming a top electrode on the metal oxide layer. The memory element preferably has set and reset voltages of opposite polarity.

Forming the bottom electrode, the metal oxide layer and the top electrode can comprises forming a stack of one or more bottom electrode layers, the metal-oxide layer and one or more top electrode layers, and patterning this stack to thereby forming the memory element.

The bottom electrode can be formed by forming a layer of a metal on the substrate, and the metal-oxide layer can then be formed by converting only an upper part of the metal layer into the metal-oxide layer. The metal layer can be converted into a metal-oxide layer by thermally oxidizing the metal layer. The process parameters of the thermal oxidation process are determined in view of the desired electrical characteristics of the memory element, wherein these process parameters are selected from the group of: oxygen partial pressure, oxidation time and/or oxidation temperature. Preferably the electrical characteristics are the set and reset voltages of the memory element.

Preferably the metal layer is heated in a substantially oxygen free ambient prior to the step of converting an upper part thereof in the metal-oxide layer.

The metal of the metal layer can be nickel. Then the metal of the metal-oxide layer can be nickel. Preferably the nickel-oxide layer is a binary nickel-oxide. The top electrode can be formed by forming a layer of nickel on the nickel-oxide layer.

The bottom electrode can comprise a nickel-containing layer adjacent to the metal-oxide layer, and a titanium-containing layer adjacent to the nickel-containing layer. This titanium-containing layer can be formed as a stack of a titanium-nitride layer adjacent to the upper metal layer, and a titanium-layer adjacent to titanium-nitride layer.

In a third aspect a method for determining the electrical characteristics of a resistivity-switching non-volatile memory element, the memory element comprising, a bottom electrode having an upper layer of metal, a resistivity-switching metal-oxide layer formed by thermal oxidation of a part of the upper metal layer, the metal-oxide layer having an oxygen gradient over its layer thickness, and a top electrode formed on the metal-oxide layer whereby the determining method comprises determining the oxygen gradient in the metal-oxide layer in view of the desired electrical characteristics of the memory element. These electrical characteristic preferably are the set and reset voltages.

The oxygen gradient can be determined by determining the values of process parameters of the thermal oxidation step wherein these process parameters are selected from the group of: oxygen partial pressure, oxidation time and/or oxidation temperature. The oxygen gradient can also be determined by selecting the thickness of the metal layer to be thermally oxidized. The oxygen gradient can also be determined by modulating the oxidation kinetics of the metal layer to be thermally oxidized. The oxidation kinetics can be modulated by heating the metal layer in a substantially oxygen-free ambient prior to the step of thermally oxidizing the metal layer thereby recrystallizing the metal layer.

The metal of the metal oxide layer and of the upper metal layer of the bottom electrode can be nickel. The nickel metal oxide is preferably a binary nickel-oxide.

The bottom electrode can further comprise a titanium-containing layer underneath the upper metal layer. Preferably the titanium-containing layer is formed as a stack of a titanium-nitride layer adjacent to the upper metal layer, and a titanium-layer adjacent to titanium-nitride layer.

BRIEF DESCRIPTION OF THE DRAWINGS

All drawings are intended to illustrate some aspects and embodiments of the present disclosure. In the drawings the relative size of some elements may differ from their actual size and not drawn to scale for illustrative purposes.

FIGS. 15a-b illustrate two integration schemes for manufacturing a memory element formed on a TiN/Ti substrate layer.

FIGS. 19a-c show relationships between Ni crystallographic structure and annealing temperature according to an embodiment:
(a) Temperature-dependence of diffraction patterns recorded under vacuum from 25 to 400° C. (100 nm thick Ni layer).
(b) Corresponding temperature-dependent evolution of $(111)_{Ni}$ integrated intensity.
(c) Using a profile fitting procedure, diffraction peak broadening analysis was performed to extract the integral breadth β of the $(111)_{Ni}$ reflection which may be interpreted in terms of Ni crystallite size.

FIG. 26 is a table (Table 1) listing the experimental conditions used to form a NiO film from Ni oxidation according to an embodiment.

FIG. 27 is a table (Table 2) listing the parameters of the Johnson-Mehl-Avrami-Kolmogorov (so-called JMAK) equation: $D(t)=D_\infty[1-\exp(-k \times t^n)]$ which may describe the nucleation/growth process of NiO crystallites in various experimental conditions (RTA conditions or in situ oxidation) according to an embodiment.

FIG. 28 is a table (Table 3) summarizing electrical behavior correlated with the presence of NiO and/or Ni phases checked by x-ray diffraction according to an embodiment. The initial Ni thickness is 100 nm (a) or 24 nm (b) (NSW=no switching; SW=switching; corresponding $V_{th}$ is given when a resistive switching is observed).

DETAILED DESCRIPTION

Figure 1:
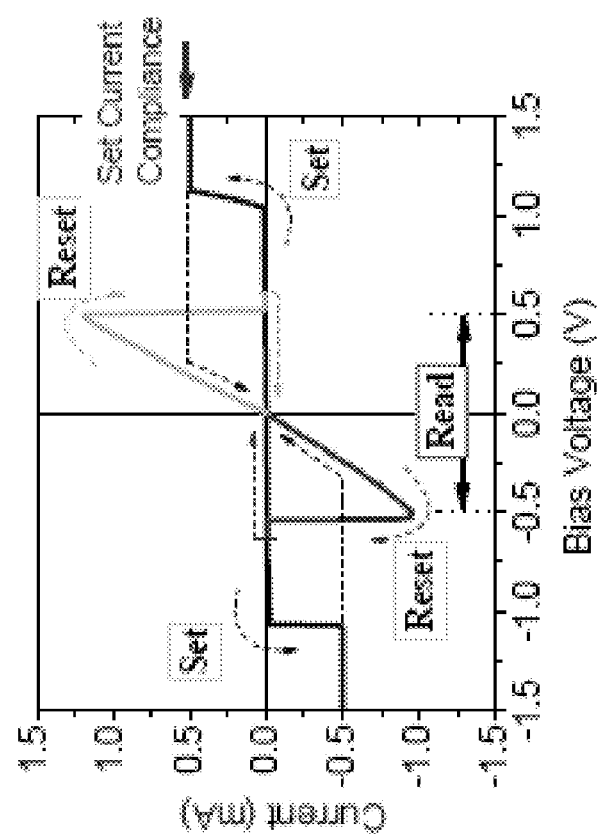
FIG. 1 discloses typical current-voltage characteristics of a prior art dc deposited nickel-oxide RRAM memory element.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Moreover, the terms over, under, underneath and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be understood that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The physical mechanism, allowing conversion from one resistivity state to another resistivity state upon applying a current or voltage signal to the active material, depends on the material used in a RRAM memory cell. In particular, the resistive switching in a binary nickel-oxide non-volatile memory was shown to be based on the respective formation/rupture of narrow filamentary conductive paths throughout the nickel-oxide film as disclosed inter alia by D. C. Kim, S. Seo, S. E. Ahn, et al in Applied Physics. Letter. 88(20), 202102 (2006). As this filamentary mechanism is expected to be insensitive to the dimensions of the non-volatile memory cell, such nickel-oxide RRAM technology could have a high downscaling potential.

Manufacturing of a multi-layer cross-point structured nickel-oxide binary Oxide Resistive RAM, also known as OxRRAM, for high-density storage applications has already been demonstrated by G. Baek, M. S. Lee, S. Seo, et al in International Electron Devices Meeting Tech. Dig., p. 587 (2004) or in international patent application WO 2006/121837, hereby incorporated by reference in its entirety. Such an OxRRAM memory cell comprises a memory element containing a resistivity-switching metal oxide sandwiched between a top electrode and a bottom electrode, thereby forming a Metal-Insulator-Metal (MIM) structure. These electrodes allow applying electrical signals, e.g. voltages or currents, to the resistivity-switching layer during operation of the memory cell e.g. for programming, erasing, or reading thereof. The memory cell preferably further comprises a selection element such as a diode or transistor, e.g. a Metal Oxide Semiconductor Field Effect Transistor (MOSFET) or a bipolar transistor, in electrical contact with one of the electrodes. This selection element assists in selective addressing of an OxRRAM memory cell when part of an array of memory cells.

In order to manufacture OxRRAM memory elements, nickel-oxide films are usually deposited by dc reactive sputtering on metallic conductive substrates as disclosed by D. C. Kim, S. Seo, S. E. Ahn, et al in Applied. Physics Letters. 88(20), 202102 (2006). The typical current-voltage switching characteristics of such OxRRAM memory elements are shown in FIG. 1 whereby the arrows indicate the direction and the sequence in which the electrical signals are applied to the OxRRAM memory element.

Initially, i.e. after forming the nickel oxide layer and before applying any external electrical bias, the nickel oxide layer is in a high-resistivity state. A voltage in the range of several volts, typically 4 to 6V, is to be applied to form a reversible resistivity-switching nickel-oxide layer. This transition from an initial high-resistivity state to a lower-resistivity state is most probably due to the initiation of conductive filament paths in the nickel-oxide layer between the top electrode and the bottom electrode. This process is called the electro-forming process and requires an initial voltage signal with amplitude higher than the amplitude required to, thereafter, switch the OxRRAM memory element between the stable resistivity states. This electro-forming process is not shown in FIG. 1.

After electro-forming the nickel-oxide layer, the OxRRAM memory element can be reversibly reset and set. The set switching, i.e. switching to the ON state or low resistivity state, is voltage controlled. The physical mechanism allowing setting of a nickel-oxide OxRRAM memory element is probably similar to a soft breakdown mechanism as it creates conductive filament paths between the bottom electrode and the top electrode. The reset switching, i.e. switching to the OFF state or high resistivity state, is current controlled and is believed to be due to an electro-thermal mechanism disrupting the conductive filament paths between the bottom electrode and the top electrode.

As shown in FIG. 1, the nickel-oxide OxRRAM memory can be operated in both unipolar and bipolar mode for reset and set switching thereof. In an unipolar operation the set and the reset voltage signals are of the same polarity, i.e. either negative or positive, while in a bipolar operation the set and reset voltages are of opposite polarity.

Whatever the operation mode, unipolar or bipolar, the amplitude of the switching voltage is different for set and reset. In practice, the more reliable and usual operation is the unipolar mode.

Figure 2:
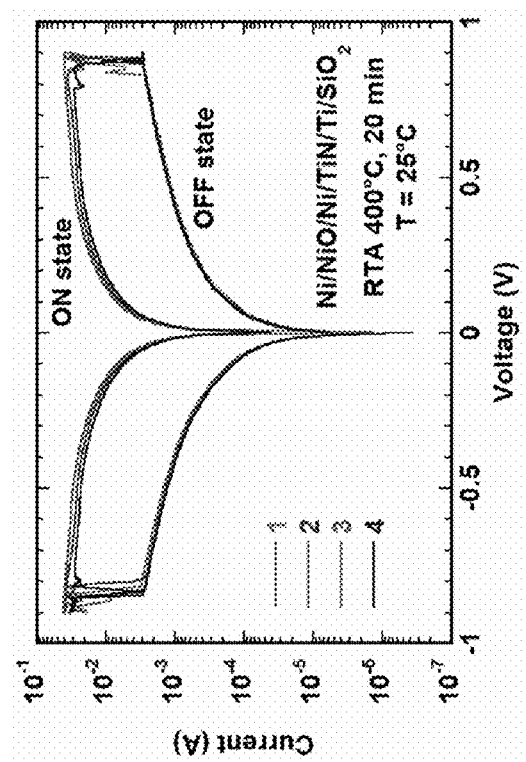
FIG. 2 discloses 4 current-voltage characteristics (1-4) of a resistivity-switching non-volatile memory device manufactured according to an embodiment, whereby the memory device was cycled 4 times between −1V and +1V. The memory device has a nickel-oxide resistivity switching layer sandwiched between a nickel top electrode and a nickel/titanium/titanium-nitride top electrode, formed on a silicon wafer, but separated therefrom by a silicon-oxide layer. The nickel-oxide layer was formed by RTA oxidation at 400° C. for 20 minutes in a pure $O_2$ ambient.

In embodiments of this description, methods are disclosed for manufacturing a resistivity-switching non-volatile memory element comprising a metal-oxide layer, preferably a nickel-oxide layer, for storing data therein. A memory element manufactured according to these embodiments has, inter alia, the following properties:

- no electro-forming process is needed as the virgin memory element is already in a low-resistivity state, i.e. the ON state. Hence the memory element can operate at low voltages as from its virgin state,
- the memory element operates only in a bipolar mode, i.e. the set and reset voltages are of opposite polarity as illustrated by FIG. 2,
- the amplitude of the switching voltage is substantially the same for both set and reset voltages as illustrated by FIG. 2,
- the amplitude of the switching voltage can be less than 1V or even less than 0.5V,
- the amplitude of this set and reset switching voltages can be adjusted by selecting the process conditions for forming the metal-oxide resistivity-switching layer,
- no thermally induced reset switching is needed, which is expected to beneficially influence the retention lifetime of the memory element, and reset is voltage-controlled instead of current-controlled,
- the memory element remains scalable as the mechanism for set and reset switching is still due to the respective formation/rupture of conductive filaments between the top electrode and the bottom electrode.

Figure 3:
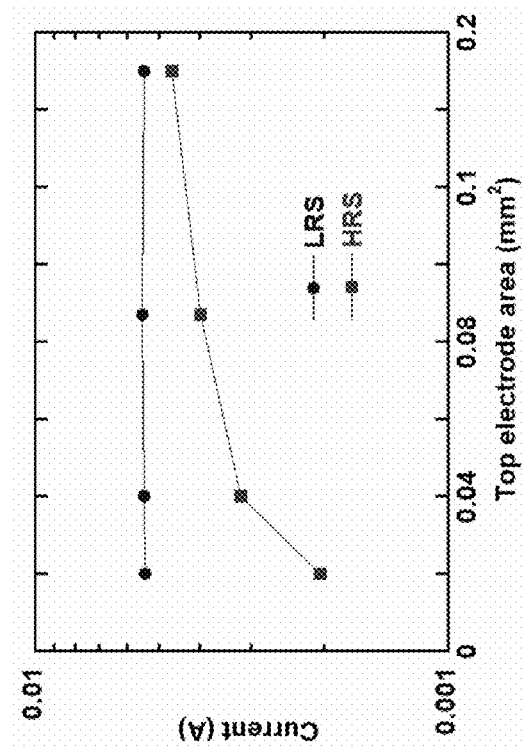
FIG. 3 discloses the dependency of the current in the ON-state (Low Resistance State or LRS) and in the OFF-state (High Resistance State or HRS) on the area of the top electrode for the resistivity-switching non-volatile memory device of FIG. 2.

This is shown in FIG. 3 where the current is measured by applying a triangular waveform with 1 Hz frequency and ±0.9 V amplitude, through a memory element manufactured according to embodiments whereby the bottom electrode and the metal oxide layer are formed as unpatterned layers extending over a substrate, while the top electrode is patterned such that the interface regions are created between the top electrode and the metal oxide layer with varying area whereby this interface area is smaller than the interface area between the metal oxide layer and the bottom electrode. In the ON-state (Low Resistance State: LRS) the current remains essentially constant with increasing top electrode area, while in the OFF-state (High Resistance State: RHS), the current increases with increasing interface area. These results indicate that the conduction in HRS is strongly dominated by the area of top electrode whereas the formation of conductive filamentary paths in the oxide explains the conduction in LRS. Given the larger area the total number of conductive filamentary paths will not vary substantially resulting in a resistance in the ON-state which doesn't scale with area in this area range.

These properties are believed to be associated with a specific process of manufacturing the resistive-switching metal-oxide layer. A feature of a metal-oxide layer according to embodiments is that an oxygen gradient exists over the thickness of the metal-oxide layer from its interface with the top electrode to its interface with the bottom electrode layer. Preferably the oxygen content in this metal-oxide layer is decreasing from the top electrode, where the metal oxide is fully oxidized with an excess of oxygen or a stoichiometric metal-oxide is obtained, towards to bottom electrode, where the metal oxide has an excess of metal. Hence the ratio of oxygen to oxygen-nickel in the nickel-oxide layer can range over the metal-oxide layer from 0, corresponding to pure nickel at one interface, to about 0.5 at the opposite interface and which corresponds to a stoichiometric binary nickel-oxide. This oxygen to oxygen-nickel ratio can even be higher than 0.5 at this opposite interface.

Figure 4:
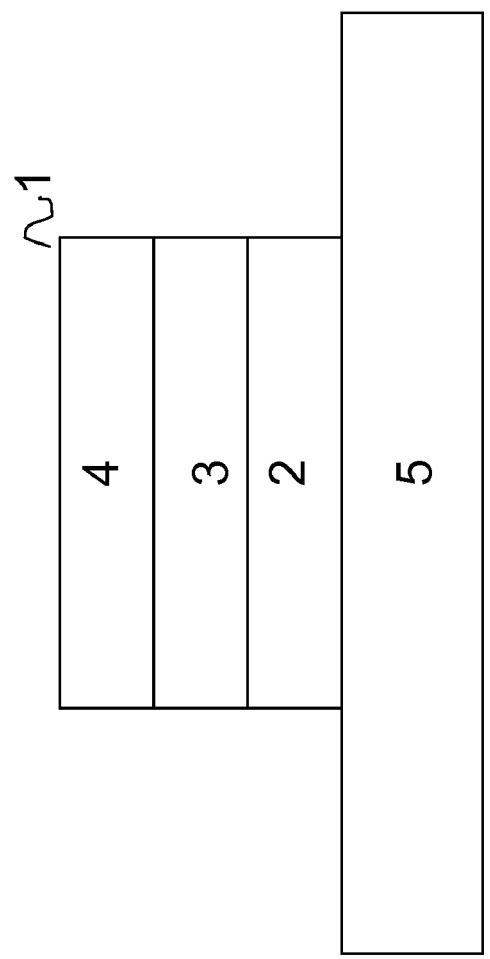
FIG. 4 shows a cross-section of a memory element according to an embodiment.

FIG. 4 shows a cross-section of a memory element 1 comprising a resistive-switching metal-oxide layer 3 sandwiched between a bottom electrode 2 and a top electrode 4. The bottom electrode 2 is formed on a substrate 5. The metal-oxide layer 3 comprises an oxygen gradient from one electrode to another, preferably this gradient is decreasing towards the bottom electrode 2.

In one preferred embodiment a process for manufacturing a resistive switching non-volatile memory element is disclosed. FIG. 4 shows a cross-section of this memory element 1 comprising a resistive-switching metal-oxide layer 3 sandwiched between a bottom electrode 2 and a top electrode 4. The bottom electrode 2 is formed on a substrate 5. The manufacturing process comprises the following steps illustrated by FIGS. 5a-d.

Figure 5A:
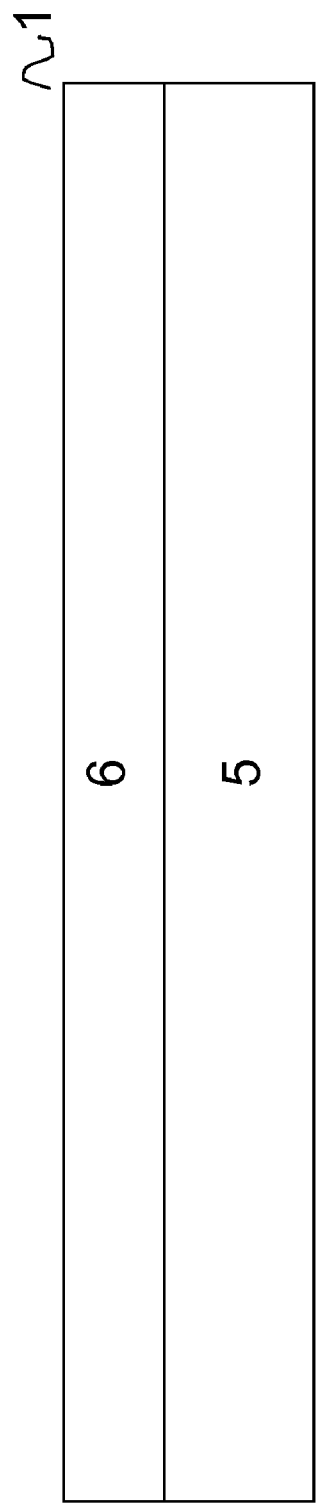
FIGS. 5a-d illustrates by means of schematic cross-sectional views a manufacturing process according to an embodiment.

As illustrated by FIG. 5a a first layer 6 of the bottom electrode 2 is formed on a substrate 5. The substrate 5 can be a silicon-based substrate such as a bulk silicon wafer, a silicon-on-insulator (SOI) substrate. Preferably the bottom electrode is electrically isolated from the substrate by a dielectric layer, such as silicon oxide and/or silicon nitride, or by a junction in-between the substrate 5 and the bottom electrode 2. The bottom electrode 2 is formed by first forming a Ti layer over the substrate 5 and then forming a TiN layer over the Ti layer. The Ti and TiN layers 6 can be deposited using an Ionized Metal Deposition (IMP) process, Physical Vapor Deposition (PVD) process or by Chemical Vapor Deposition (CVD) process. Typically about 20 nm of Ti and about 40 nm of TiN is deposited. The thickness of Ti and TiN can range from 3 to 100 nm.

Figure 5B:
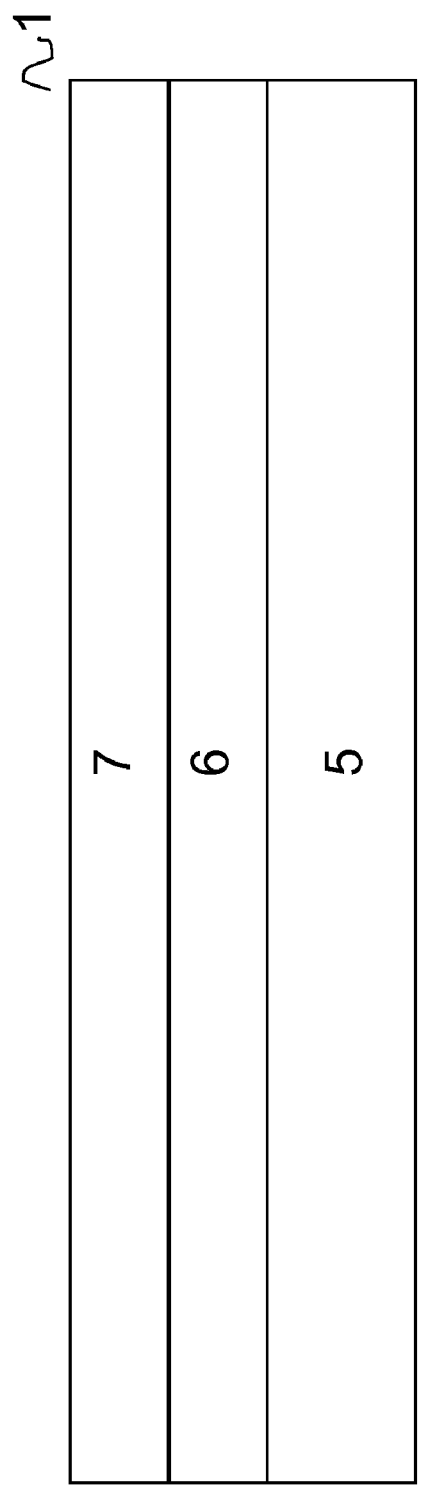

As illustrated by FIG. 5b a nickel metallic film 7 is formed on the exposed TiN surface 6. The Ni layer 7 can be deposited using an Ionized Metal Deposition (IMP) process, Physical Vapor Deposition (PVD) process or by Chemical Vapor Deposition (CVD) process. Typically about 100 nm of Ni is deposited. The thickness of the Ni layer typically is in the range of about 20 nm to about 250 nm, typically about 100 nm. After depositing the Ni layer 7 a thermal treatment is performed on the layer stack 6,7. This thermal treatment step in an oxygen-free ambient is aimed at stabilizing the microstructure, such as grain size and crystal orientation of the as-deposited Ni layer 7, essentially without oxidizing the Ni layer 7. Preferably the layer stack 6,7 is heated during this thermal treatment step in a vacuum ambient. Typically a thermal anneal step at about 400° C. for about 10 minutes under vacuum conditions to prevent preliminary oxidation of the Ni layer 7, can be used. Typically the temperature is in the range from 400 to 500° C. for a time of 10 to 20 minutes. This anneal step is believed to stabilize and enhance the (111) crystal orientation of the as-deposited Ni layer 7 and to slow down the oxidation kinetics of the as-deposited Ni layer 7, thereby allowing a better control of the oxygen gradient of the nickel-oxide resistive-switching layer 3 and hence of the threshold voltage of the memory element 1. During this heating step the upper layer 7 of the bottom electrode 2 is believed to recrystallize.

Figure 5C:
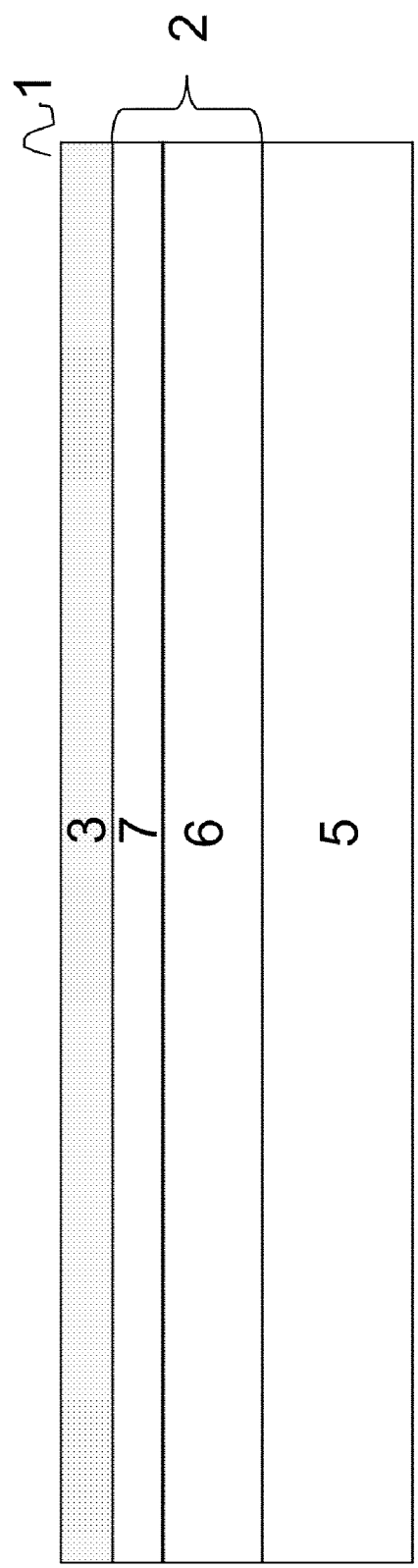

As illustrated by FIG. 5c the annealed Ni layer 7 is at least partially converted into a nickel-oxide layer 3 having an oxygen gradient over at least a part its thickness. The exposed upper part of the Ni layer 7 does contains oxygen, while a lower part of the Ni layer 7 remains unoxidized and is part of the bottom electrode 2. Near the interface with the unoxidized nickel layer 7 the nickel-oxide layer 3 has an excess of nickel, while towards the exposed part of the nickel-oxide layer 3, the nickel in the nickel-oxide layer is substantially fully oxidized and a stoichiometric nickel-oxide may be obtained near the exposed surface. At the surface upon which the top electrode 4 is to be formed the oxide may even be in excess of the stoichiometric composition.

The unoxidized bottom part of the nickel layer 7 provides a good adherence and low contact resistance for oxidized upper part. This conversion of the nickel layer 7 into a stack of a nickel-oxide layer 3 and a nickel layer 7 can be done using various process such thermal oxidation of the nickel layer, plasma oxidation of the nickel layer using e.g. microwave remote plasma oxidation, implantation of oxygen in the upper part of the nickel 7 followed by a thermal treatment step to form the nickel-oxide layer 3.

If thermal oxidation is used to convert the nickel layer 7, the oxygen gradient in metal-oxide layer 3 is controlled by process parameters of the thermal oxidation step such as partial oxygen pressure, oxidation time and oxidation temperature. Different durations of the thermal oxidation step may be used to adjust the thickness and the oxygen gradient of metal-oxide layer 3 and optimize the memory window of the memory element 1. Likewise, the thermal oxidation step may be done at different oxygen partial pressures to determine the thickness and oxygen gradient of metal-oxide layer 3 and hence of the electrical characteristics such as memory window and threshold voltage of the memory element 1. Typically a Rapid Thermal Anneal (RTA) in pure oxygen at a temperature up to 400° C. is used to oxidize an upper part 3 of the nickel layer 7. As said above the oxidation kinetics are also dependent on the morphology of the annealed Ni layer 7, which is determined, inter alia, by the underlying metal layers 6 and the oxygen-free anneal step. Preferably the nickel layer 7 is only partially oxidized such that a nickel layer remains near the substrate 5.

Figure 5D:
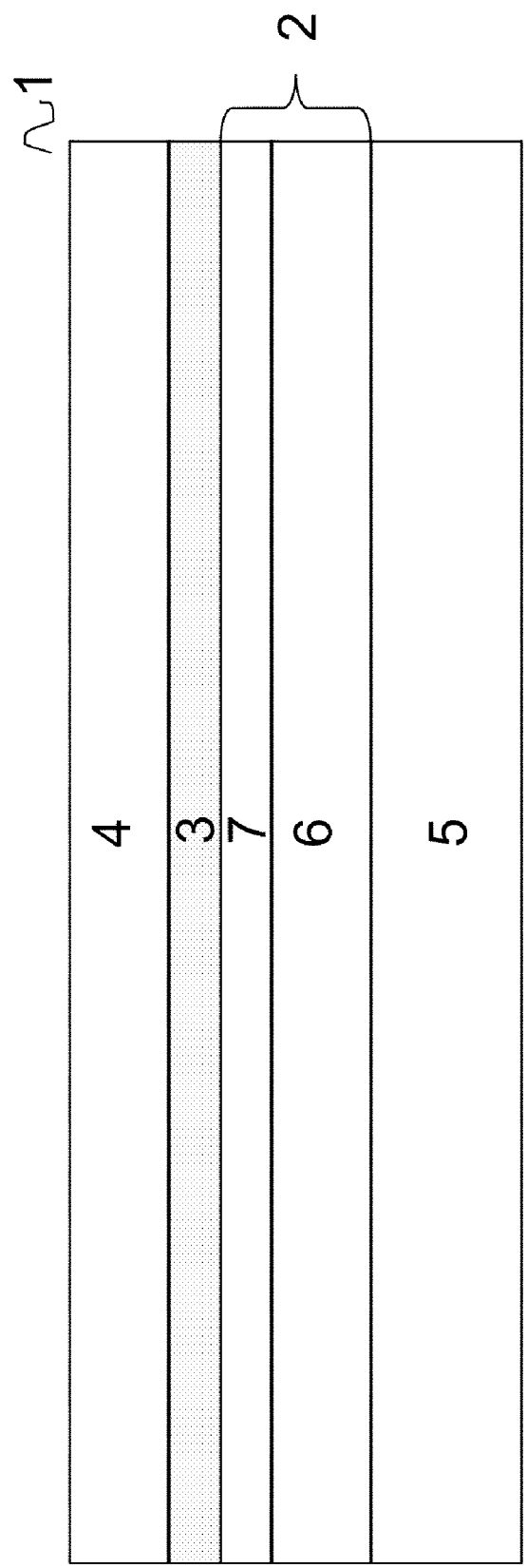

As illustrated by FIG. 5d the top electrode 4 is formed on the metal-oxide layer 3 by forming one or more layers using an Ionized Metal Deposition (IMP) process, Physical Vapor Deposition (PVD) process or by Chemical Vapor Deposition (CVD) process. The material these top electrode layers can be Ni, Ti, TiN, Pt. Preferably Ni is used to form the top electrode 4.

After forming the stack of bottom electrode layers 2, metal-oxide layer 3 and top electrode layers 4, this stack is patterned resulting in an array of the memory elements 1, like the memory element shown in FIG. 4. As know by a person skilled in the art additional processing is performed to form an interconnect structure, allowing electrical access to an individual memory element for programming, writing and erasing thereof. Examples of interconnect structures and the manufacturing thereof are disclosed in international application WO 20007/062014 hereby incorporated by reference. Here a diode is integrated in the memory element as selection element, but as appreciated by a skilled person a transistor such as a MOSFET or a bipolar transistor can be present in the substrate 5 such that to each memory element 1 an individual transistor is connected as selection element.

In one preferred embodiment a process for manufacturing a resistive switching non-volatile memory element is disclosed. FIG. 4 shows a cross-section of this memory element 1 comprising a resistive-switching metal-oxide layer 3 sandwiched between a bottom electrode 2 and a top electrode 4. The bottom electrode 2 is formed on a substrate 5. The manufacturing process comprises the following steps illustrated by FIGS. 6a-d.

Figure 6A:
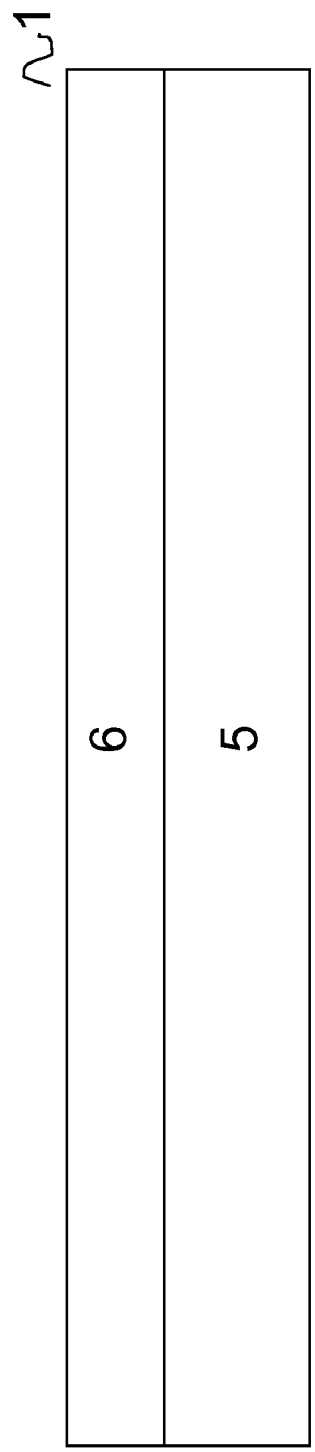
FIGS. 6a-d illustrates by means of schematic cross-sectional views a manufacturing process according to an embodiment.

As illustrated by FIG. 6a the bottom electrode 2 is formed on a substrate 5. The substrate 5 can be a silicon-based substrate such as a bulk silicon wafer, a silicon-on-insulator (SOI) substrate. Preferably the bottom electrode is electrically isolated from the substrate by a dielectric layer, such as silicon oxide and/or silicon nitride, or by a junction in-between the substrate 5 and the bottom electrode 2. The bottom electrode 2 is preferably formed by first forming a Ti layer over the substrate 5 and then forming a TiN layer over the Ti layer. The Ti and TiN layers 6 can be deposited using an Ionized Metal Deposition (IMP) process, Physical Vapor Deposition (PVD) process or by Chemical Vapor Deposition (CVD) process. Typically about 20 nm of Ti and about 40 nm of TiN is deposited. The thickness of Ti and TiN can range from 3 to 100 nm.

Figure 6B:
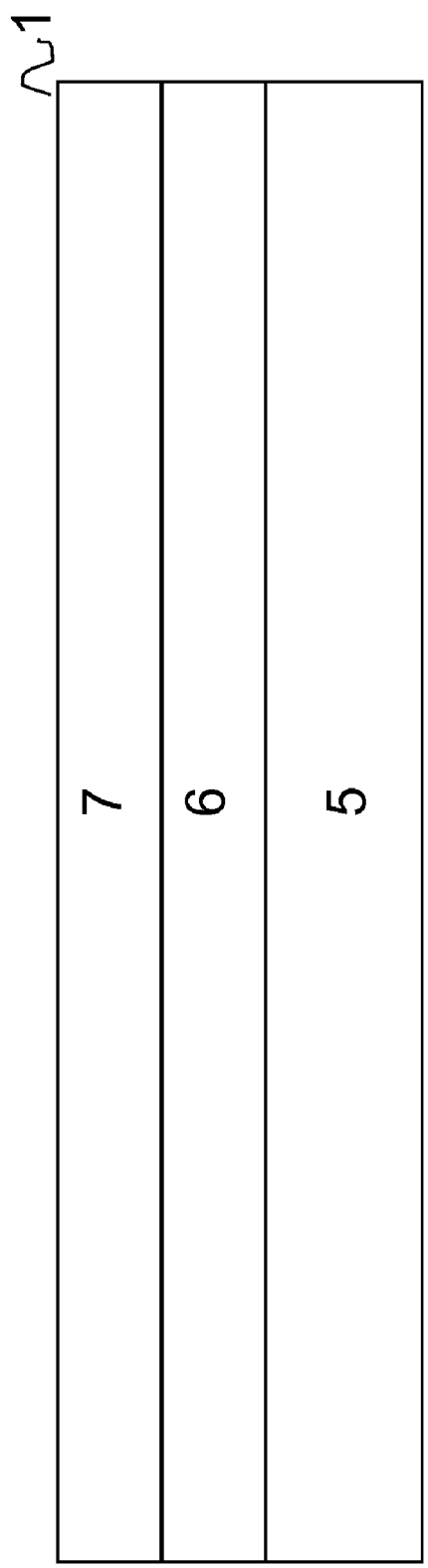

As illustrated by FIG. 6b a sacrificial nickel metallic film 7 is formed on the exposed TiN surface 6. The Ni layer 7 can be deposited using an Ionized Metal Deposition (IMP) process, Physical Vapor Deposition (PVD) process or by Chemical Vapor Deposition (CVD) process. Typically about 100 nm of Ni is deposited. The thickness of the Ni layer typically is in the range of about 20 nm to about 250 nm, typically about 100 nm. After depositing the Ni layer 7 a thermal treatment is performed on the layer stack 6,7. This thermal treatment step in an oxygen-free ambient is aimed at stabilizing the microstructure, such as grain size and crystal orientation of the as-deposited Ni layer 7, essentially without oxidizing the Ni layer 7. Preferably the layer stack 6,7 is heated during this thermal treatment step in a vacuum ambient. Typically a thermal anneal step at about 400° C. for about 10 minutes under vacuum conditions to prevent preliminary oxidation of the Ni layer 7, can be used. Typically the temperature is in the range from 400 to 500° C. for a time of 10 to 20 minutes. This anneal step is believed to stabilize and enhance the (111) crystal orientation of the as-deposited Ni layer 7 and to slow down the oxidation kinetics of the as-deposited Ni layer 7, thereby allowing a better control of the oxygen gradient of the nickel-oxide resistive-switching layer 3 and hence of the threshold voltage of the memory element 1. During this heating step the upper layer 7 of the bottom electrode 2 is believed to recrystallize.

Figure 6C:
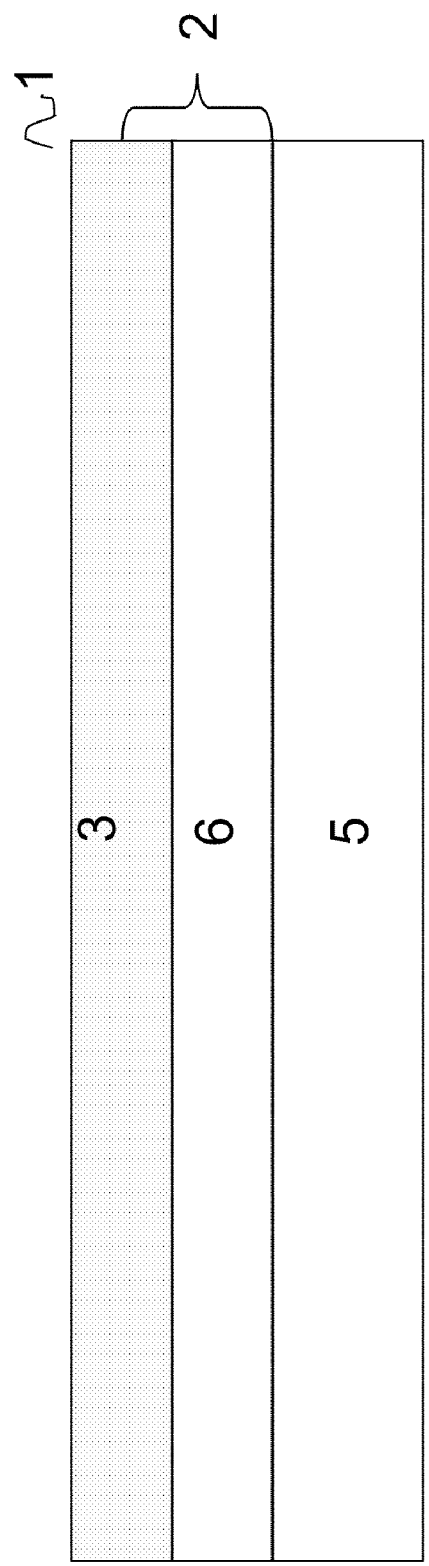

As illustrated by FIG. 6c the annealed Ni layer 7 is at converted into a nickel-oxide layer 3 having an oxygen gradient over its thickness. Near the interface with the bottom electrode 2 the nickel-oxide layer 3 has an excess of nickel, while towards the exposed part of the nickel-oxide layer 3, the nickel in the nickel-oxide layer is substantially fully oxidized and a stoichiometric nickel-oxide may be obtained near the exposed surface. At the surface upon which the top electrode 4 is to be formed the oxide may even be in excess of the stoichiometric composition.

If thermal oxidation is used to convert the nickel layer 7, the oxygen gradient in metal-oxide layer 3 is controlled by process parameters of the thermal oxidation step such as partial oxygen pressure, oxidation time and oxidation temperature. Different durations of the thermal oxidation step may be used to adjust the thickness and the oxygen gradient of metal-oxide layer 3 and optimize the memory window of the memory element 1. Likewise, the thermal oxidation step may be done at different oxygen partial pressures to determine the thickness and oxygen gradient of metal-oxide layer 3 and hence of the electrical characteristics such as memory window and threshold voltage of the memory element 1. Typically a Rapid Thermal Anneal (RTA) in pure oxygen at a temperature up to 400° C. is used to oxidize an upper part 3 of the nickel layer 7. As said above the oxidation kinetics are also dependent on the morphology of the annealed Ni layer 7, which is determined, inter alia, by the underlying metal layers 6 and the oxygen-free anneal step. Preferably the nickel layer 7 is only partially oxidized such that a nickel layer remains near the substrate 5.

Figure 6D:
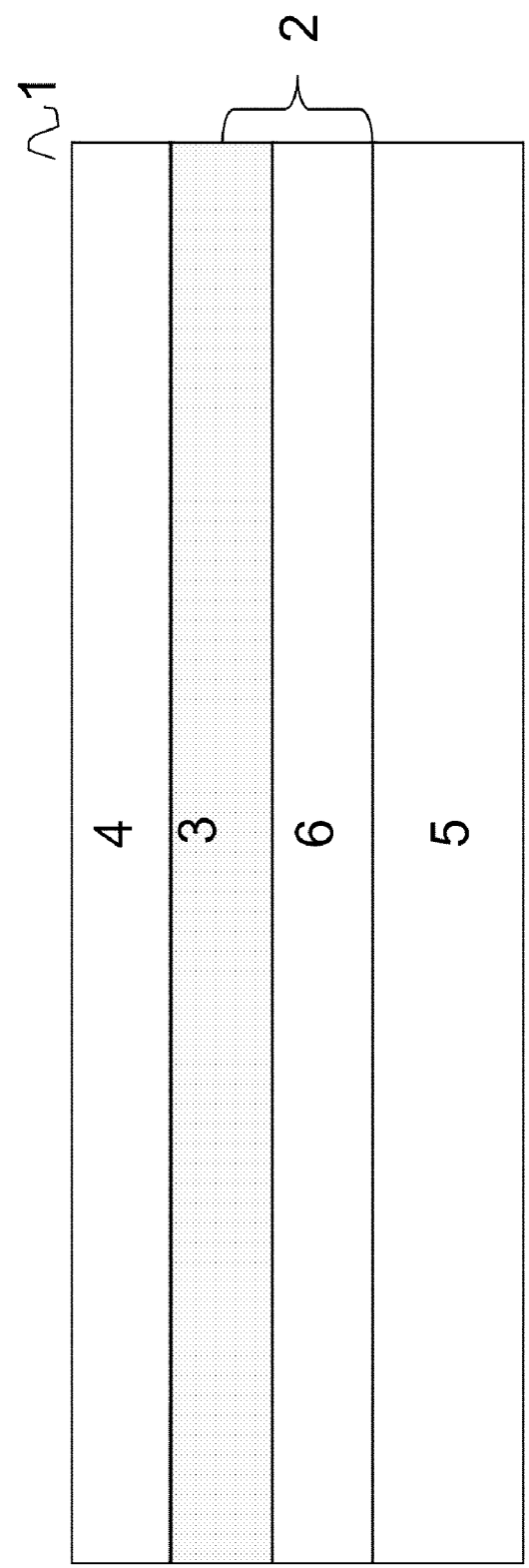

As illustrated by FIG. 6d the top electrode 4 is formed on the metal-oxide layer 3 by forming one or more layers using an Ionized Metal Deposition (IMP) process, Physical Vapor Deposition (PVD) process or by Chemical Vapor Deposition (CVD) process. The material these top electrode layers can be Ni, Ti, TiN, Pt. Preferably Ni is used to form the top electrode 4.

After forming the stack of bottom electrode layers 2, metal-oxide layer 3 and top electrode layers 4, this stack is patterned resulting in an array of the memory elements 1, like the memory element shown in FIG. 4. As know by a person skilled in the art additional processing is performed to form an interconnect structure, allowing electrical access to an individual memory element for programming, writing and erasing thereof. Examples of interconnect structures and the manufacturing thereof are disclosed in international application WO 20007/062014 hereby incorporated by reference. Here a diode is integrated in the memory element as selection element, but as appreciated by a skilled person a transistor such as a MOSFET or a bipolar transistor can be present in the substrate 5 such that to each memory element 1 an individual transistor is connected as selection element.

In the embodiments illustrated by FIGS. 5a-d and 6a-d a nickel layer 7 was first deposited and the oxidized to form the metal oxide layer 3. However the metal oxide 3 layer can also be formed by reactive sputtering of nickel and oxide on the bottom electrode 2. This bottom electrode 2 can have an upper nickel layer 7 similar to the stack shown in FIG. 5c. Preferably this upper nickel layer 7 is formed on a titanium containing layer. Preferably this titanium containing layer is a stack of a titanium-nitride on a titanium layer. The bottom electrode 2 can have as upper layer another metal layer as shown in FIG. 6c, e.g. Pt, Ti, W. During reactive sputtering, the oxygen content in the gas mixture of oxygen and argon, defined as the ratio of oxygen partial pressure to the total pressure present in the deposition chamber, is varied. Preferably the oxygen content in the deposition chamber is increased during the deposition process. Initially the oxygen content is below 5%, corresponding to layer with excess metal, and can be increased when further forming nickel-oxide layer 7 to a maximum of about 20%, corresponding to a layer with excess oxygen, when the nickel-oxide layer is completely deposited.

In one embodiment, process conditions and experimental results obtained for a memory element comprising a stack of $NiO/Ni/SiO_2/Si$ or a memory element comprising a stack of $NiO/Ni/Ni/TiN/Ti/SiO_2/Si$ are disclosed. The NiO resistivity-switching layer is formed by thermal oxidation of a nickel layer. As example the dependency of the reset voltage, i.e the threshold voltage at which the memory element is switched form an ON-state to an OFF-state, on the oxidation process parameters is shown. Oxidation parameters are oxidation time, oxygen content expressed as oxygen partial pressure, oxidation temperature. The influence of performing an additional annealing step on the as-deposited nickel layer on the oxidation kinetics of such annealed nickel layer is studied by measuring the sheet resistance of the oxidized layer. Such an annealing step will help recrystallizing as-deposited nickel layer such the subsequent oxidation process is retarded. By forming the nickel layer 7 on a TiN/Ti layer the oxidation process of the as-deposited nickel layer can be accelerated. This TiN/Ti layer is also believed to improve the mechanical stability of the nickel-oxide layer.

Table 1 (FIG. 26) lists the experimental conditions used to form a NiO film from Ni oxidation. A layer of Ni is deposited on a multilayer substrate containing $SiO_2$ on $Si_3Ni_4$ on Si. The formed Ni layer was either 100 nm or 24 nm. Oxidation of the Ni layer was done in a RTA furnace varying several process parameters: temperature, oxidation time, oxidizing atmosphere as listed in table 1.

Figure 7:
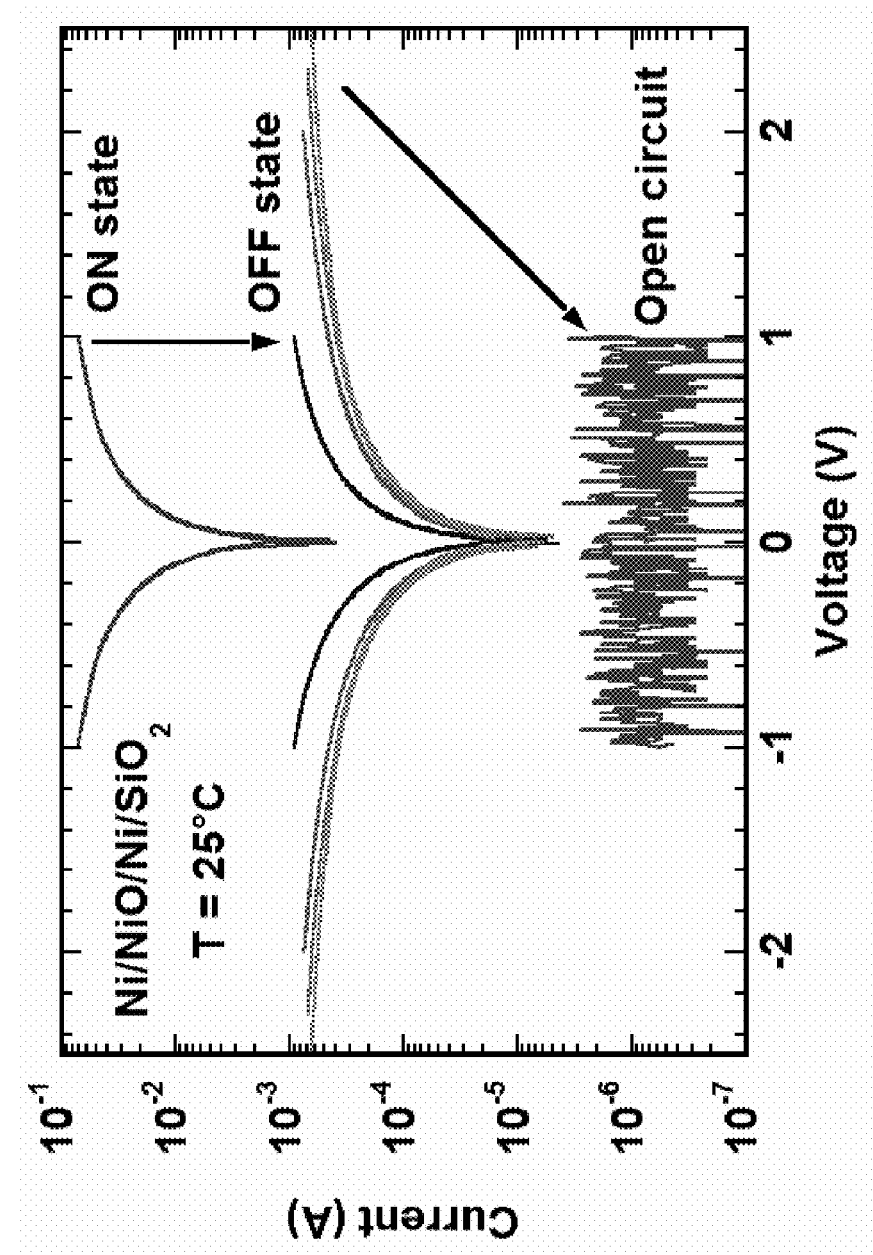
FIG. 7 illustrates the electrical properties of a Ni/NiO/Ni/$SiO_2$/$Si_3N_4$/Si stack according to an embodiment.

FIG. 7 shows the current through the thus formed structure as function of the voltage over this structure containing the NiO layer sandwiched between two Ni electrodes (Ni/NiO/Ni). Initially the samples are in the ON state. At the threshold voltage $V_{th}$ the structure switches to the OFF-state. When the voltage is increased the switching becomes irreversible and finally the structure switches to a "open circuit" status in which a very low current is flowing.

Figure 8:
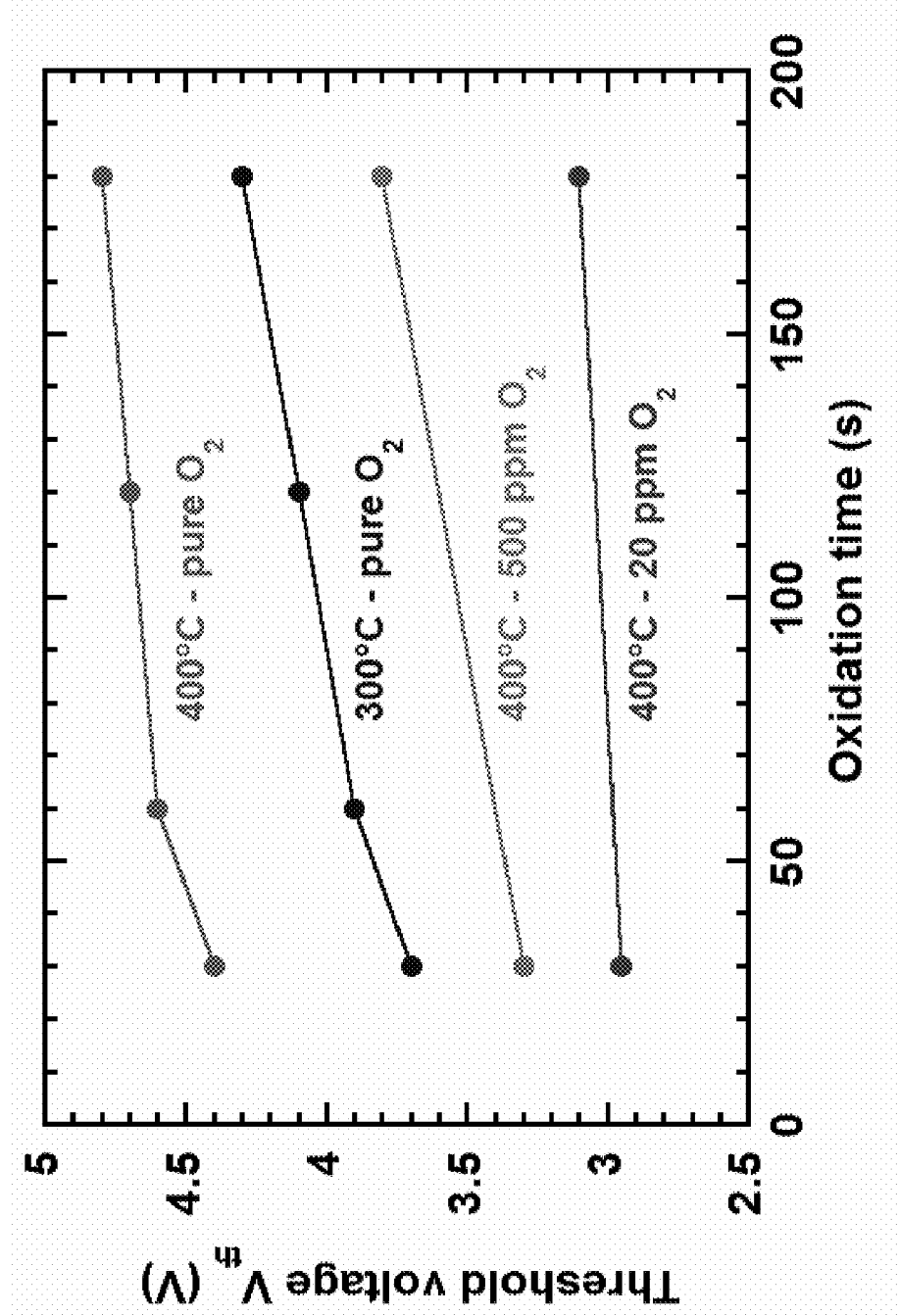
FIG. 8 illustrates the threshold voltage of a Ni/$SiO_2$/$Si_3N_4$/Si stack as function of oxidation process parameters according to an embodiment.

FIG. 8 shows the influence of the process parameters on the threshold voltage $V_{th}$. The threshold voltage increases with increasing temperature, increasing oxidation time and increasing partial pressure of oxygen in the oxidizing ambient. Depending on the requirements of the memory applications, the threshold voltage can be tailored towards the required value by tuning the corresponding process parameters.

During the oxidation of the Ni film, the NiO film is grown in a time dependent manner with a progressive consumption of this Ni film. The Ni film will undergo micro structural changes during heating prior to oxidation as Ni grains will grow thereby resulting in a roughness at the NiO/Ni interface and a NiO film with irregular thickness. Also delamination of the NiO layer at the NiO/Ni interface and at the $SiO_2$ was observed. During the RTA oxidation of the Ni two growth mechanisms are competing: oxidation of the Ni layer and recrystallisation of this Ni layer.

Figure 9:
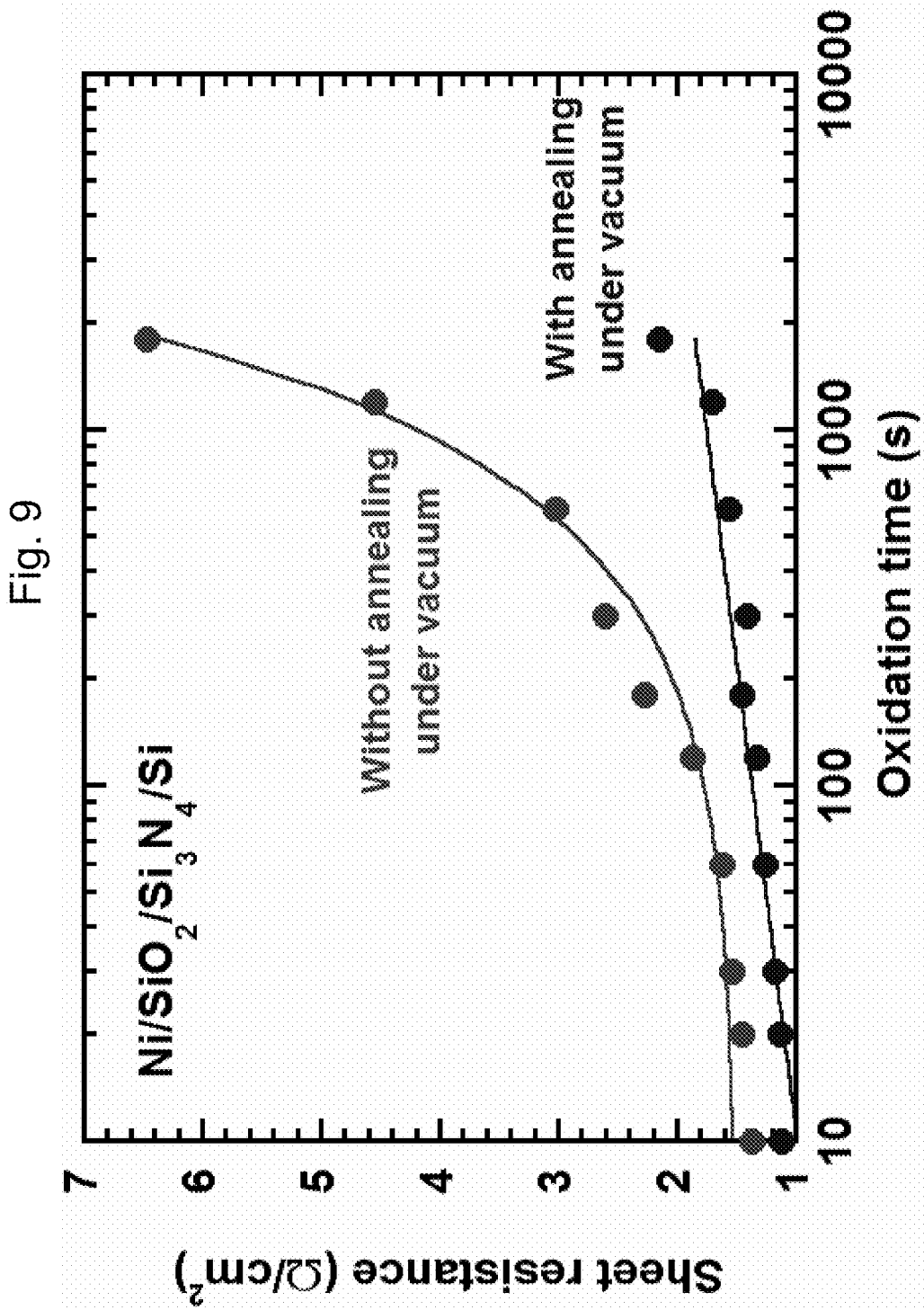
FIG. 9 illustrates the effect of annealing the as-deposited Ni in a Ni/$SiO_2$/$Si_3N_4$/Si stack prior to the oxidation of this as-deposited Ni layer on the sheet resistance according to an embodiment.

FIG. 9 illustrates the effect of an additional treatment step on the as-deposited Ni film prior to the oxidation step. If the as-deposited Ni layer is subjected to an RTA oxidation then the sheet resistance will increase with oxidation time. However, if the as-deposited Ni layer is subjected to an annealing step, e.g. 500° C. during 10 minutes under vacuum conditions, then the sheet resistance of the Ni layer remains essentially constant with oxidation time. Annealing the as-deposited Ni layer prior to the oxidation step thus results in slower oxidation kinetics.

Figure 10:
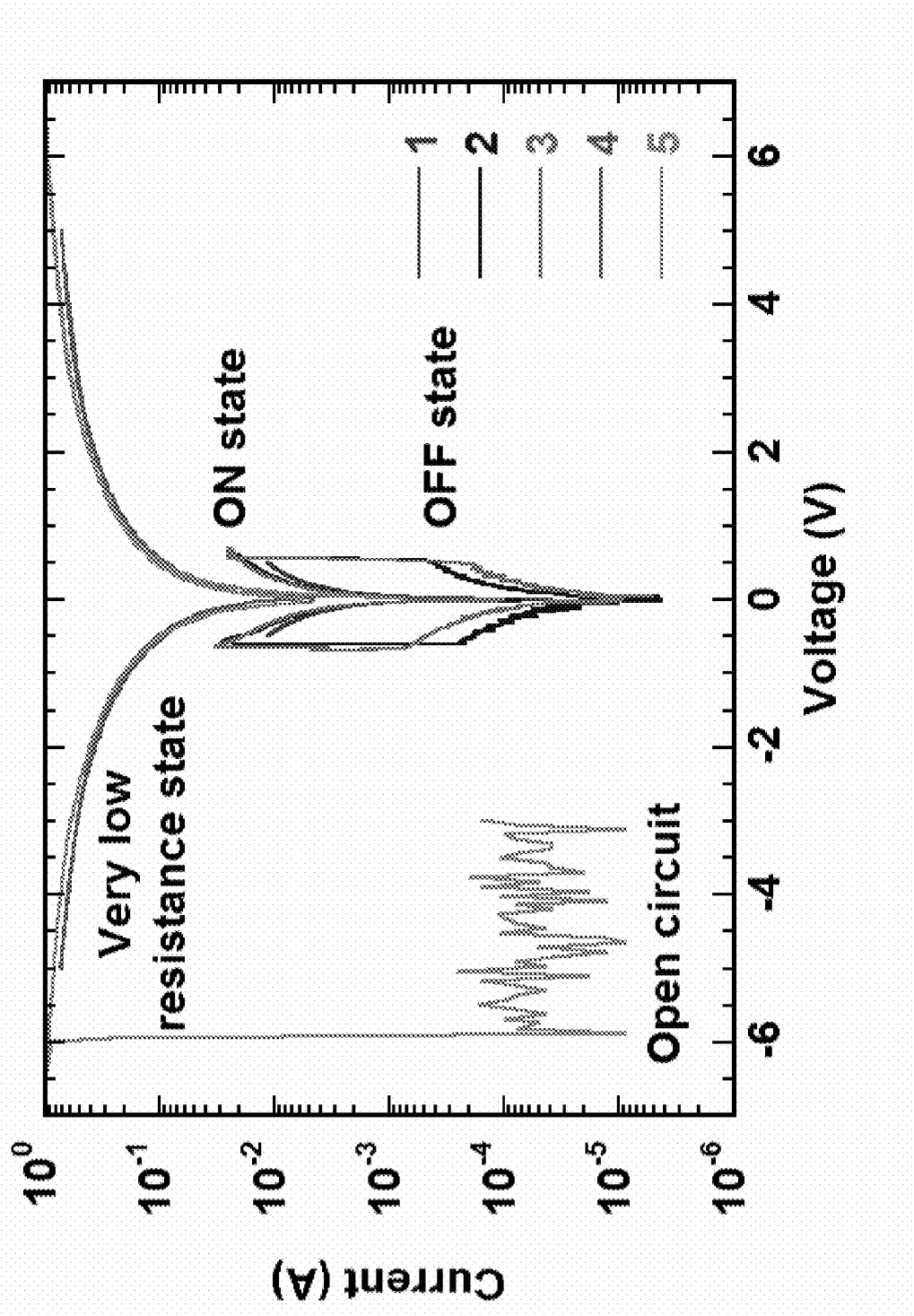
FIG. 10 illustrates the electrical properties of a Ni/NiO/Ni/$SiO_2$/$Si_3N_4$/Si stack whereby the Ni layer is annealed prior to oxidation thereof according to an embodiment.

The effect of this additional annealing step on the electrical behavior of the memory cell is illustrated by FIG. 10. Initially the samples are still in the ON state. At low voltages, e.g. less than 2V, reversible switching between OFF and ON states occurs with varying voltage. With increasing applied voltage, the samples remain first in a very high current level and will finally switch to an "open circuit" status in which a very low current is flowing. Hence the annealing of the as-deposited Ni layer prior to oxidation results in improved electrical properties.

Figure 11:
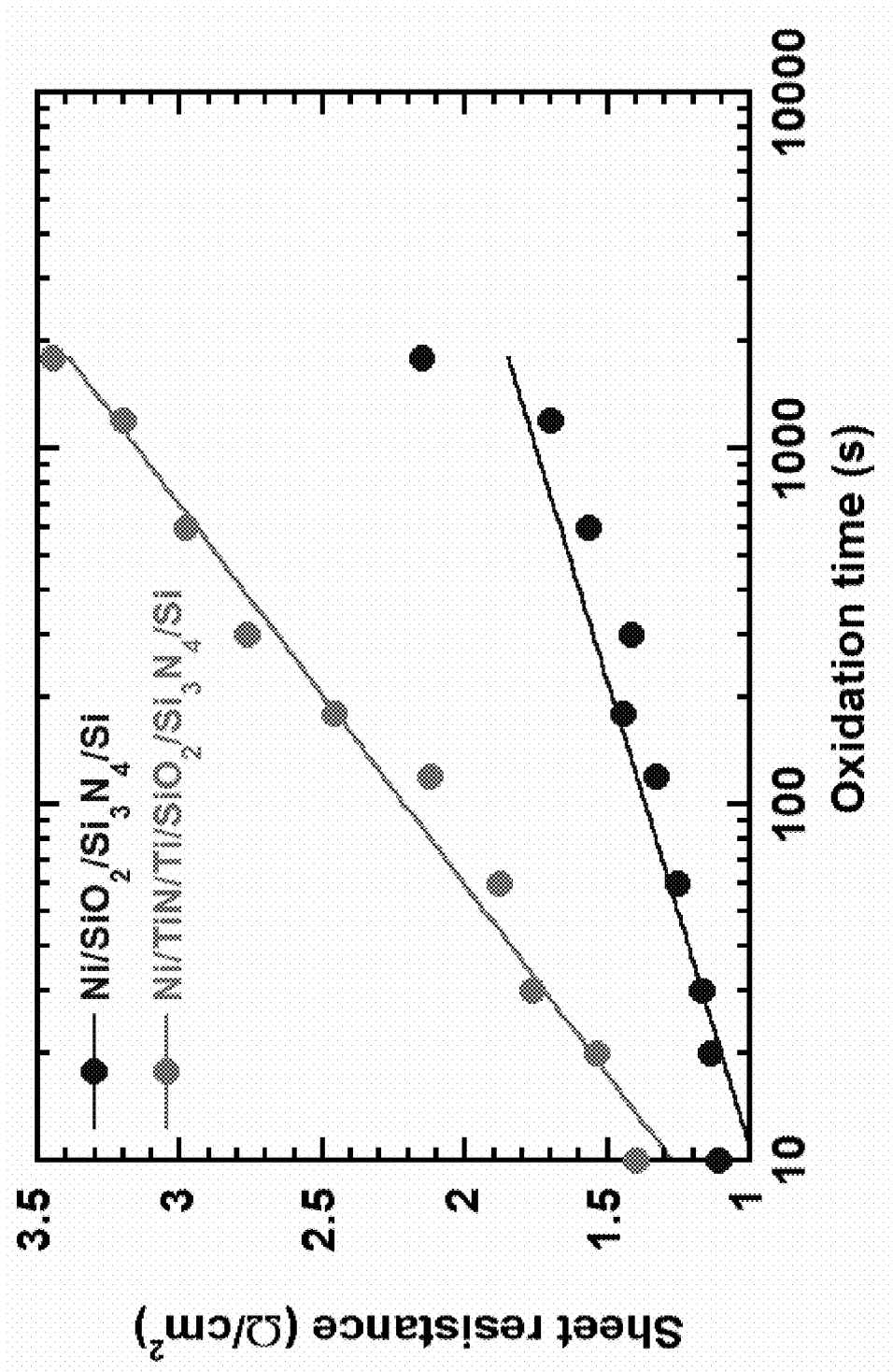
FIG. 11 illustrates the effect of the substrate (TiN/Ti vs $SiO_2$) on which the Ni layer is of formed on the oxidation kinetics of this Ni layer according to an embodiment.

Whereas in the experiments illustrated by FIGS. 7 to 10, the stack of Ni top electrode/NiO switching layer/Ni bottom electrode was formed on a $SiO_2$ layer, additional samples were formed similar to the samples used in these previous experiments but whereby an additional TiN/Ti layer stack was inserted between the Ni layer and the $SiO_2$ film. On top of the $SiO_2$ film 20 nm of Ti was formed. On this Ti layer 40 nm of TiN was formed. Then either 24 nm or 100 nm of Ni was formed, which Ni layer will be subjected to an oxidation step to form the NiO switching layer. On this NiO layer a Ni top electrode layer is formed. Again the as-deposited Ni layer is annealed under vacuum. The various samples were subjected to an oxidation in the RTA furnace whereby the temperature and oxidation time was varied. FIG. 11 shows the sheet resistance as function of the oxidation time for samples with a Ni/$SiO_2$/$Si_3N_4$/Si stack and with a Ni/TiN/Ti $SiO_2$/$Si_3N_4$/Si stack. The substrate on which the to-be-oxidized Ni film is formed, e.g. $SiO_2$ or Ti/TiN, influences the sheet resistance. In case of a TiN/Ti substrate the oxidation kinetics is faster as shown by the increased sheet resistance of the unoxidized part of the Ni film.

Figure 12:
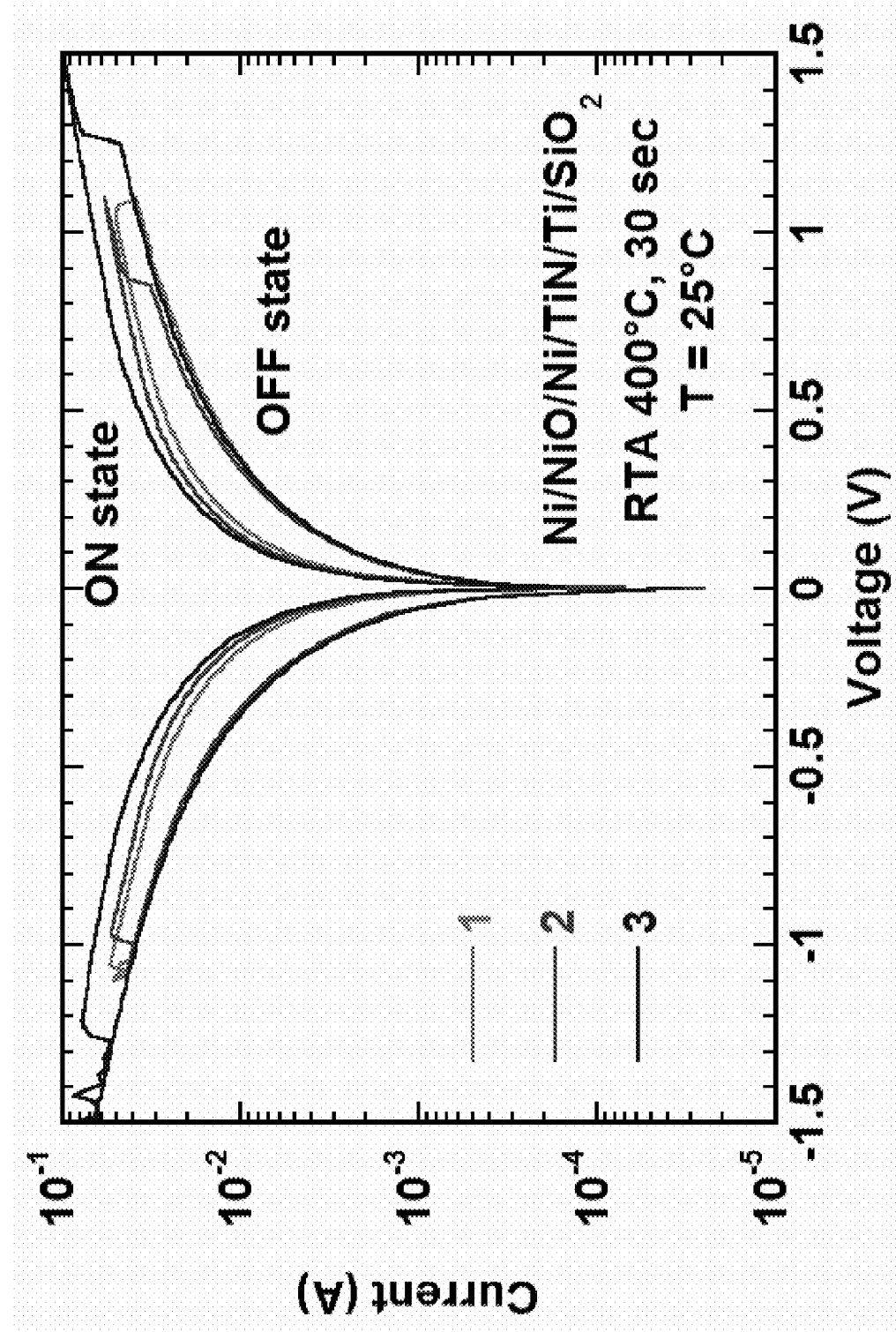
FIGS. 12-14 illustrate the electrical properties of a Ni/NiO/Ni/TiN/TiSiO_2 stack whereby the Ni layer is annealed prior to oxidation thereof according to an embodiment.
Figure 13:
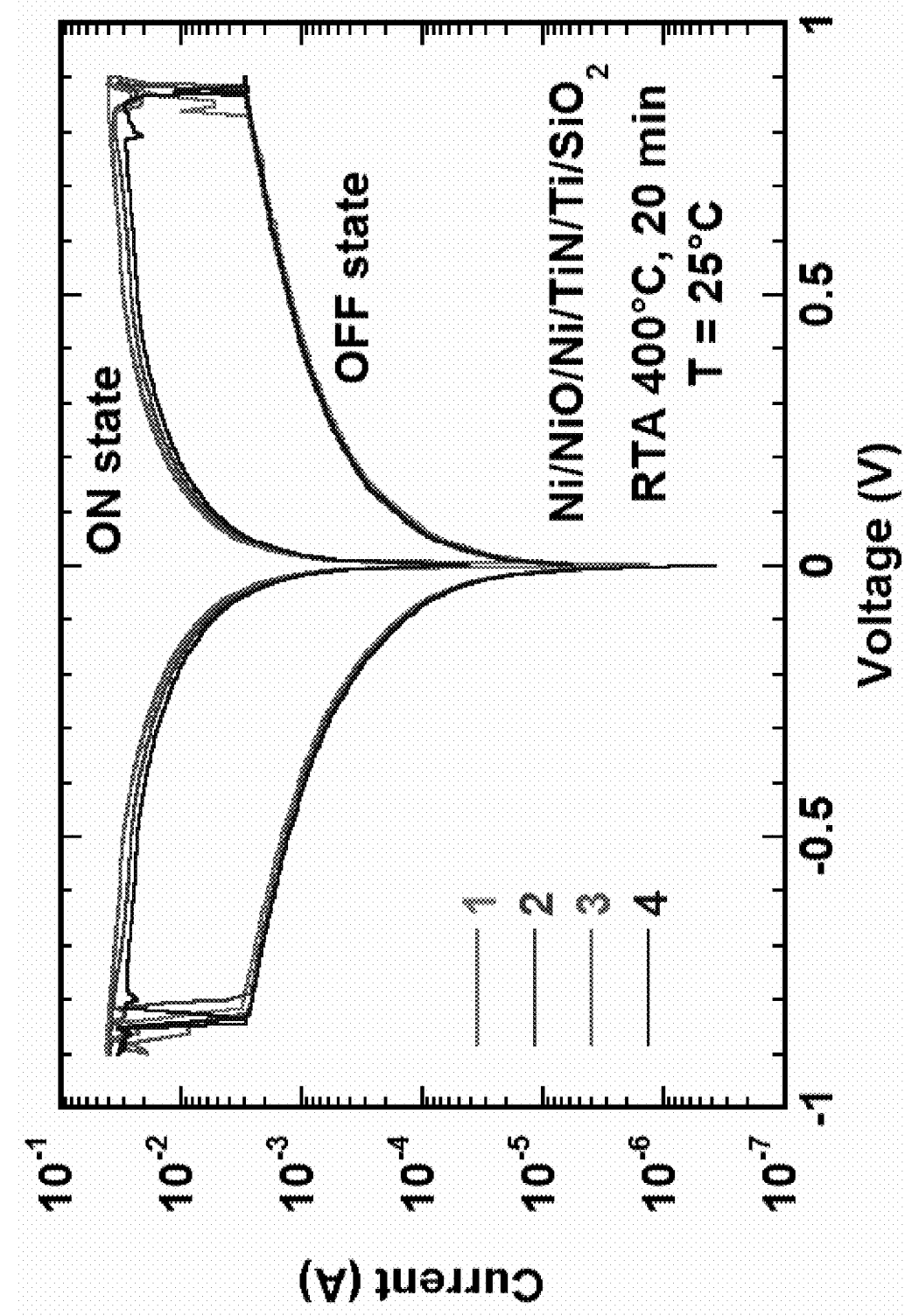
Figure 14:
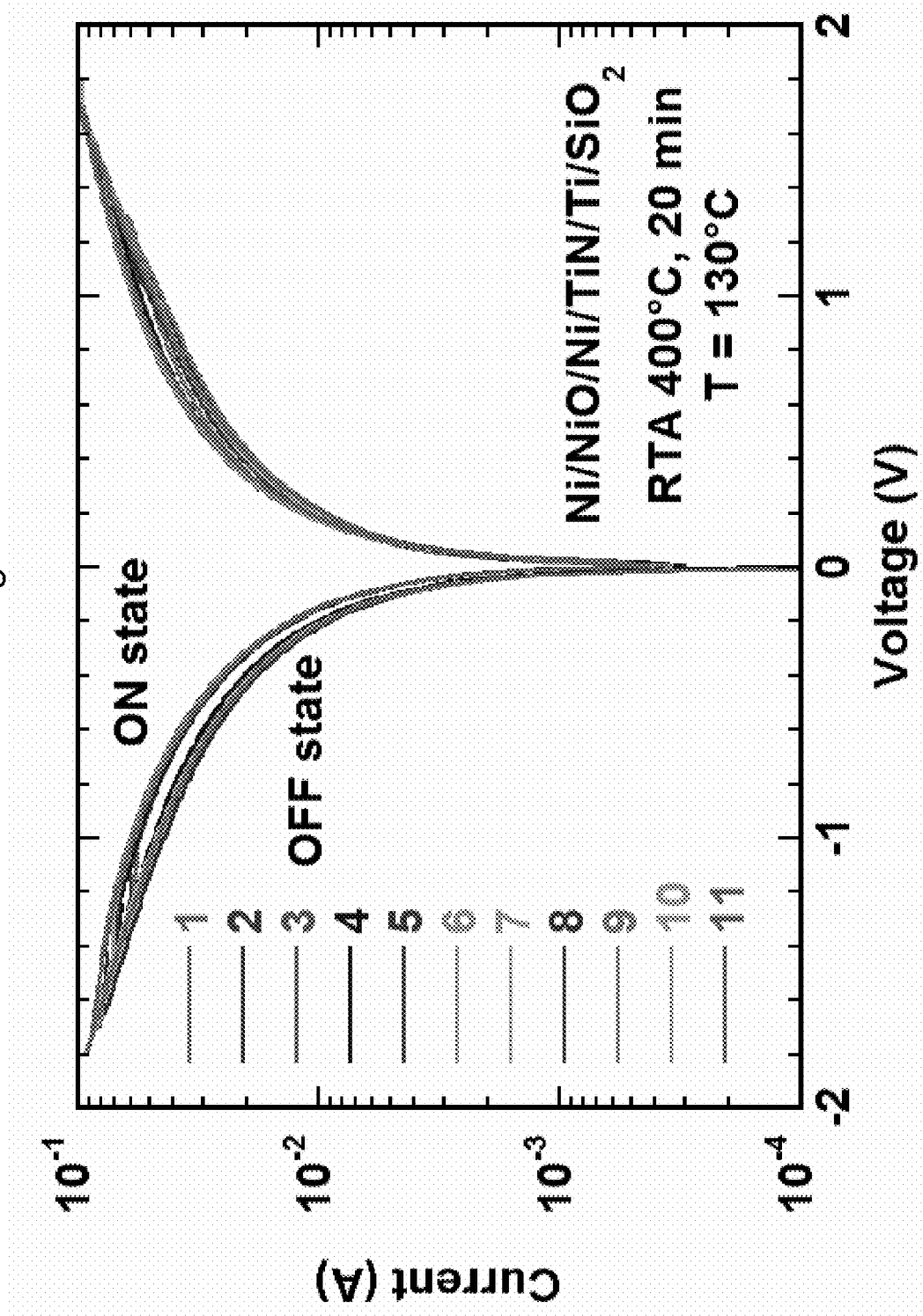

The effect of the TiN/Ti on the electrical behavior of the thus obtained memory cell is illustrated by FIGS. 12-14. Initially the samples are in the ON state. Within a voltage range of −1V to +1V a reversible and repetitive switching behavior is observed. A good discrimination between the high and low currents is obtained. This discrimination can be tuned by the oxidation time as shown by FIG. 13 in comparison with FIG. 12 whereby an increased oxidation time results in an increased memory window, i.e. spacing between ON state and OFF state. This discrimination also depends on the testing temperature. As shown in FIG. 14 the memory operation window is shrunk when measured at 130° C. Hence the preferred structure is NiO/Ni/TiN/Ti/$SiO_2$ stack whereby the Ni layer is subjected to an annealing step prior to the oxidation thereof to form the NiO memory switching layer.

FIG. 15a-b illustrates two integration schemes. In FIG. 15a, a TiN/Ti is formed on a $SiO_2$ layer. Then a $SiO_2$ layer is formed overlying this TiN/Ti layer stack. Openings are formed in this overlying $SiO_2$ layer to exposed parts of this TiN/Ti layer. In the thus-formed openings Cu and/or W can be deposited and subsequently oxidized to form the memory switching layer.

In FIG. 15b, a TiN/Ti is formed on a $SiO_2$ layer. A Ni layer is formed overlying this TiN/Ti layer stack. Then a $SiO_2$ layer is formed overlying this Ni/TiN/Ti layer stack. Openings are formed in this overlying $SiO_2$ layer to exposed parts of this Ni/TiN/Ti layer. In the thus-formed openings the exposed Ni layer can be oxidized to form the NiO memory switching layer. This way a matrix of memory elements with a common bottom electrode is formed. Each memory element will then be contacted via separate top electrodes. These openings can have a diameter of 150 nm or less.

In another embodiment a detailed analysis is provided of the dependency of the electrical characteristics, in particular of the set and reset voltages, of a memory element manufactured according to embodiments on oxidation process parameters and on the microstructure of the nickel layer to be partially oxidized.

In this embodiment the possibility of forming NiO-based MRM structures from the partial oxidation of a blanket Ni metallic film using a Rapid Thermal Annealing route, the remaining Ni layer being used as bottom electrode, is studied. X-ray diffraction was used to apprehend the Ni oxidation kinetics while transmission electron microscopy enabled investigating local microstructure and film interfaces. These analyses have especially emphasized the predominant role of the as-deposited Ni metallic film microstructure (size and orientation of crystallites) on (i) oxidation kinetics, (ii) NiO film microstructural characteristics (crystallite size, texture and interface roughness) and (iii) subsequent electrical behavior. On this latter point, the as-grown NiO films were initially in the low resistance ON state without the electroforming step usually used in forming sputtered films. Above the threshold voltage varying from 2 to 5 V depending on oxidation conditions, the Pt/NiO/Ni MRM structures irreversibly switched into the high resistance OFF state. This irreversibility is thought to originate in the microstructure of the NiO films that would cause the difficulty to re-form conductive paths.

Experimental Results

1. Introduction

Resistive switching phenomena controlled by external currents or voltages have been under investigation for future high-density non-volatile memory devices. The resistive switching-based memory concept enables the integration of the memory element in contacts and interconnects resulting in very small memory cells. Additionally, this concept makes possible a 3-dimensional stacking. Resistive memory materials range from organic (e.g. copper tetracyano quinodimethane) to inorganic materials (e.g. chalcogenide alloys, perovskite-type oxides or transition metal oxides) with either metallic or conductive oxide electrodes. For inorganic materials, bi-stable switching phenomena have been reported in many simple metal oxides such as $Nb_2O_5$, $Al_2O_3$, $Ta_2O_5$, $TiO_2$, NiO or $ZrO_2$. Typical current-voltage I(V) characteristic of Metal/Resistive oxide/Metal (MRM) structures exhibits a drastic change in resistance between a high resistance state (i.e. OFF state) and a low resistance state (i.e. ON state). Among transition metal oxides, NiO is a promising material due to its compatibility with standard CMOS process, its high ON/OFF ratio and simple constituents. Resistance switching in crystalline nickel oxide films was observed in 1964 by and the switching mechanism was explained by a reversible formation/rupture of filamentary conductive paths from the interfaces throughout the NiO film.

In the literature, most of the polycrystalline NiO films are deposited by dc (direct current) reactive sputtering on conductive substrates to fabricate MRM structures. In the experimental results described herein, an alternative way was explored using a Rapid Thermal Annealing (RTA) route. Hence, NiO-films were produced from the partial oxidation of a blanket Ni metallic film used as bottom electrode, this approach being similar to the one proposed to form bi-stable $CuO_x$/Cu stacks. Several process parameters, such as oxidation time, annealing temperature and oxygen partial pressure, were tested to control the growth of NiO films. In addition to the electrical testing, x-ray diffraction experiments enabled apprehending the Ni oxidation kinetics whereas cross-sectional transmission electron microscopy (TEM) was used to observe both the stack microstructure and films interfaces.

2. Experimental Details

Ni metallic films with 24 or 100 nm thickness were deposited at room temperature by dc physical vapor deposition (Applied Materials sputtering tool) on $SiO_2/Si_3N_4$/Si substrates. The film deposition was performed in a base pressure of few mTorr with a dc power source of 400 or 2 000 W for thinner and thicker films respectively (corresponding deposition rates: 10 and 55 nm/min). Different RTA treatments were evaluated to oxidize the Ni films: several process parameters such as oxidation time (from 10 seconds to 30 minutes), annealing temperature (200, 300 and 400° C.) and oxygen partial pressure (pure $O_2$; 20 and 500 ppm $O_2$) were tested. After the Ni oxidation, a 100 nm thick Pt top electrode (TE) was sputtered through a shadow mask with feature sizes ranging from 1 000 to 160 μm in order to test the electrical behavior of elementary MRM structures.

Local TEM observations coupled with energy dispersive spectroscopy (EDS) analyses were carried out to investigate the microstructure of Ni and NiO films. TEM samples were prepared by focused ion beam (FIB) technique ($Ga^+$ ions accelerated at 30 kV; a low current ion beam was used to clean the surface at the end of the preparation) and imaging was performed using a Tecnai $G^2$ (FEI Company) at 200 kV (wavelength of 0.0251 Å). EDS analyses were performed with an EDAX instrument using a Si(Li) detector with a thin beryllium window enabling analysis of elements with Z>11.

X-ray texture analyses were performed on a Siefert 4-circles diffractometer in the Schulz reflection geometry. Copper radiation emitted from an x-ray tube was monochromatized ($\lambda_{K\alpha}$ (Cu)=1.5418 Å) and collimated using a bi-dimensional multilayer optical system from Xenocs. Stereographic pole figures were measured by scanning the tilt angle χ between 0 and 90° in steps of 3°, and the azimuthal angle Φ between 0 and 360° in steps of 3°. The pole figures are the projection of the diffraction intensity of a given Bragg reflection as the sample is rotated. The experimental data were corrected for background.

X-ray diffraction technique was used to apprehend the oxidation kinetics of Ni metallic films in different experimental conditions. After each thermal treatment, ex situ analyses were performed to check the presence of Ni and NiO phases. Diffraction patterns were registered at room temperature on a Siemens-Bruker D5000 diffractometer configured in Bragg-Brentano geometry, operating with $CuK_\alpha$ radiation and equipped with a diffracted-beam monochromator and Soller slits. Data were collected in the angular range 36-46° in 2θ with steps of 0.02° to measure the intensities of (111) Bragg reflections of Ni and NiO phases. Using a profile fitting procedure, a peak broadening analysis was performed to extract average size of Ni and NiO crystallites (experimental data were corrected for instrumental broadening).

Besides, in situ x-ray diffraction experiments were performed on a Bruker D8 Advance x-ray diffractometer equipped with an Anton-Paar HTK 1200N furnace enabling temperature-dependent measurements under controlled atmosphere. The experimental conditions were as follows: after heating under vacuum from 25° C. to the nominal temperature with heating rate of 18° C./min, an isothermal treatment at 400 or 500° C. was applied in pure oxygen. Data were collected every 10 seconds using a linear detector (Bruker Vantec 1) over the same angular domain 36-46° in 2θ with steps of 0.00741°. A peak broadening analysis was also performed to apprehend the time and temperature-dependent evolution of Ni and NiO crystallite sizes.

Current-Voltage I(V) characteristics were measured on MRM structures with AixACCT TF Analyzer 2000 system using either triangular waveform (typically ±5 V and 10 Hz; corresponding voltage sweep: 0.2 V/msec) or staircase voltage ramp (voltage step: 0.1 V; dwell time: 1 sec per step). From these measurements, the bi-stable resistive behavior of NiO films was checked and the switching threshold voltage $V_{th}$ was determined (when a switching occurred). The MRM structures being initially in ON state, the threshold voltage corresponded to the switching from low to high resistance state. Moreover, low ($R_{ON}$) and high ($R_{OFF}$) resistances were deduced from the slope of I(V) characteristics. Values of $V_{th}$, $R_{ON}$ and $R_{OFF}$ were then correlated with process parameters.

Figure 16:
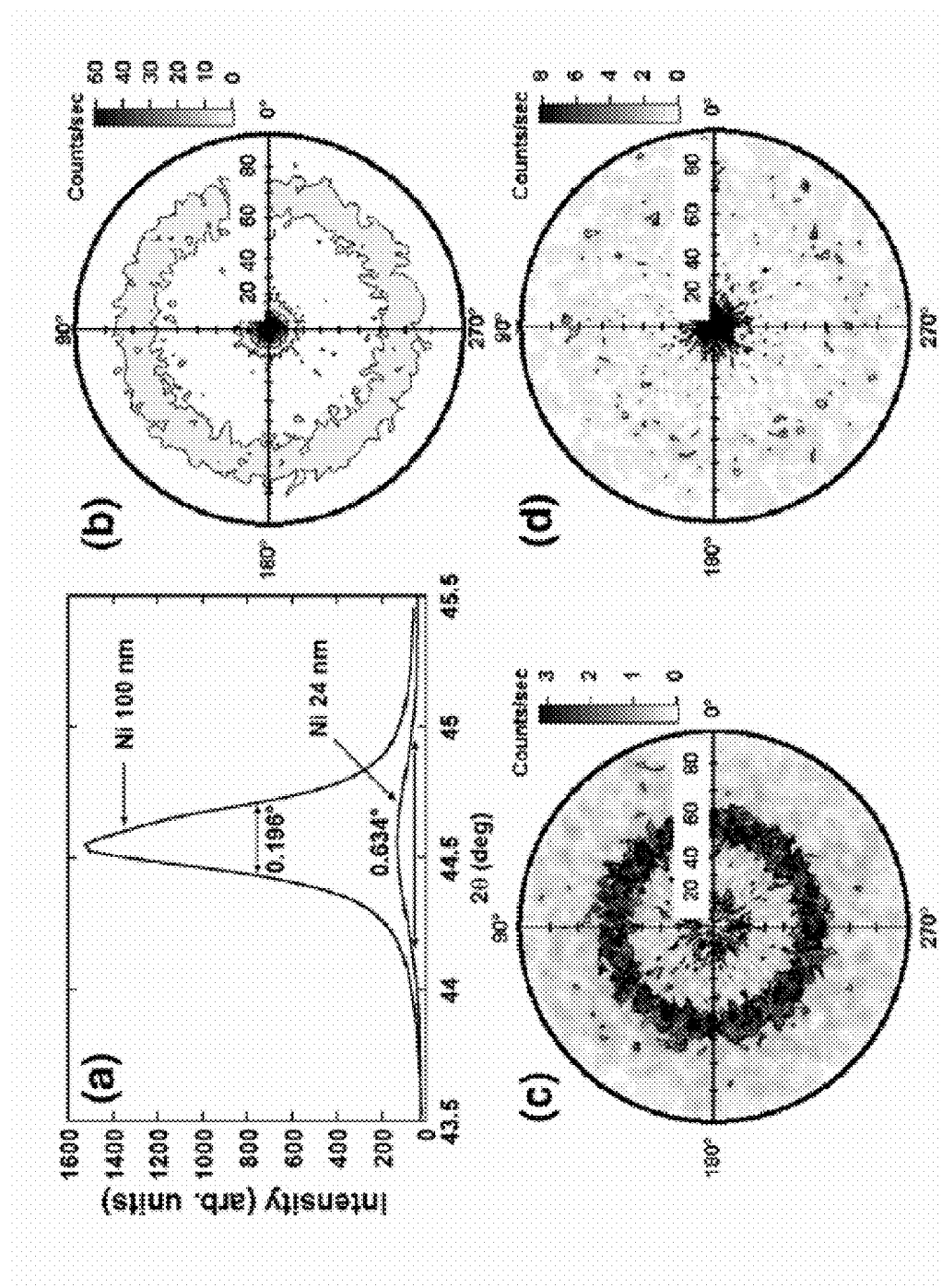
FIGS. 16a-d show XRD profiles according to an embodiment:
(a) Comparison of $(111)_{Ni}$ Bragg reflections for 24 and 100 nm thick Ni layers prior to oxidation (θ-2θ diffraction patterns).
(b) $\{111\}_{Ni}$ and (c) $\{200\}_{Ni}$ pole figures of a non-oxidized 100 nm thick Ni layer.
(d) $\{111\}_{NiO}$ pole figure of NiO film formed from oxidation of Ni layer (100 nm thick) at 400° C. for 120 seconds in pure $O_2$.

3. Microstructure and Growth Kinetics of NiO Films 3.1 Microstructural Analysis of Ni and NiO Films Preliminary θ-2θ diffraction patterns were collected on 24 and 100 nm thick Ni layers before the oxidation step. As seen in FIG. 16a, x-ray diffraction profiles of $(111)_{Ni}$ reflection show that the initial 100 nm Ni layer presents a stronger texture along [111] direction as compared to the 24 nm Ni layer. Moreover, interpreting the width of $(111)_{Ni}$ diffraction peak in terms of crystallite size, the 24 nm Ni layer presents much smaller crystallites (≈10 nm) as compared to those of the 100 nm Ni layer (≈40 nm).

Further x-ray texture analyses were performed on a non-oxidized 100 nm thick Ni layer on $\{111\}_{Ni}$ and $\{200\}_{Ni}$ Bragg reflections. On one hand, the $\{111\}_{Ni}$ pole figure shown in FIG. 16b gives a qualitative description of the orientation of the as-deposited Ni film. The maximum intensity of the $(111)_{Ni}$ Bragg reflection is at the center of the pole figure, the [111] directions being dispersed over a revolution cone centered on the substrate's normal and with about 5° of full width at half maximum. On the other hand, the $\{200\}_{Ni}$ pole figure (FIG. 16c) shows a drastically lower texture with a random orientation of [200] directions around the substrate's normal. Thus, both $\{111\}_{Ni}$ and $\{200\}_{Ni}$ pole figures indicate a strong [111] fibre texture of the Ni layer.

Similar texture analysis was performed on the NiO film obtained from Ni oxidation (100 nm thick layer) at 400° C. for 120 seconds in pure $O_2$. On the $\{111\}_{NiO}$ pole figure (FIG. 16d), the maximum intensity is centered and the rest of the intensity is spread over a wide angular range. This intensity distribution clearly indicates a texture of the NiO layer along [111] direction even if this texture is much lower than the one observed on Ni metallic film. Consequently, the crystallographic orientation of NiO grains appears to be conditioned by the texture of the underlying Ni film since the NiO films preferentially grow with the [111] direction parallel to the substrate's normal.

Figure 17:
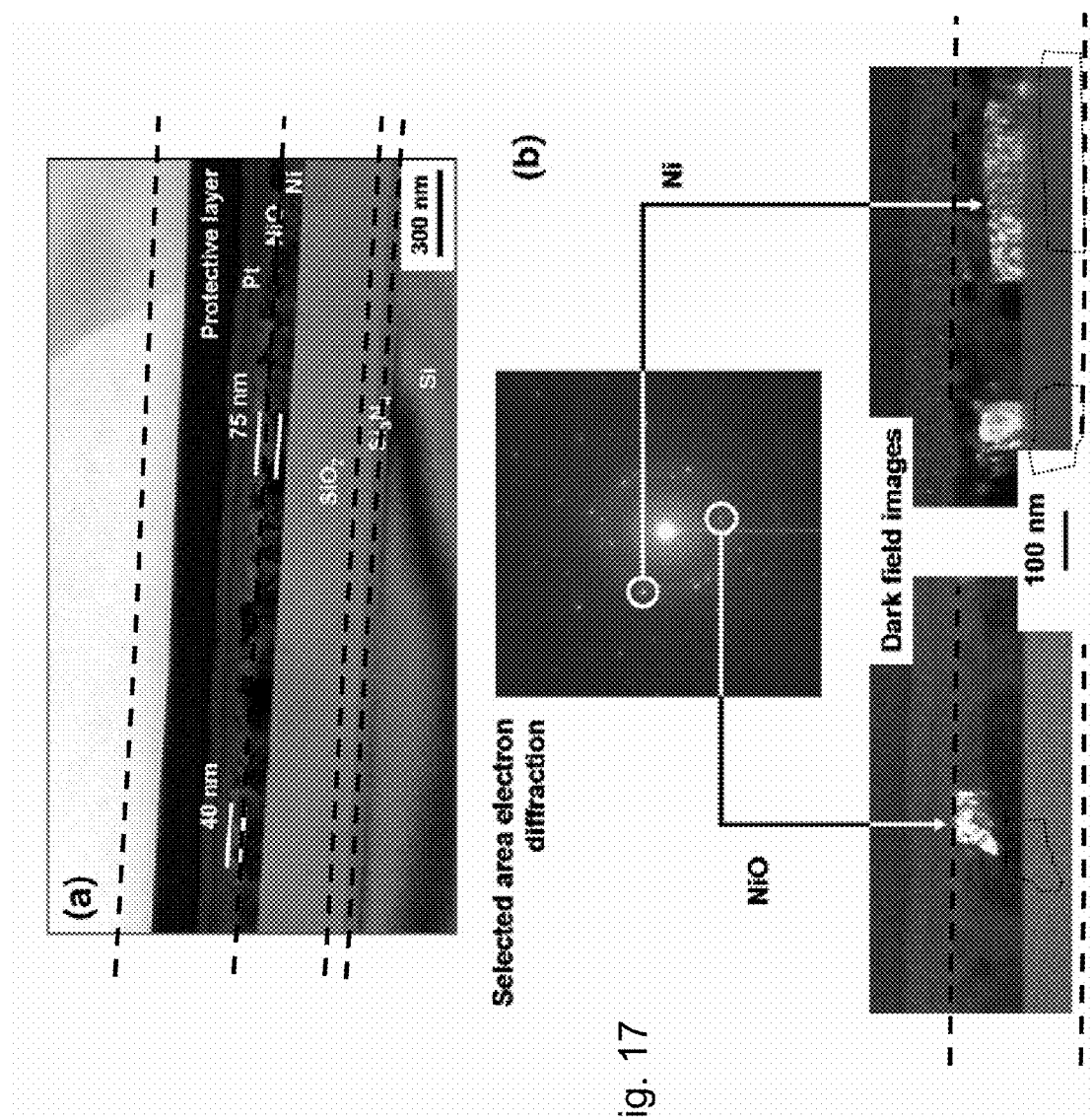
FIGS. 17a-b show TEM cross-section according to an embodiment:
(a) TEM cross-section of the stack Pt/NiO/Ni/$SiO_2$/$Si_3N_4$/Si: the NiO film was obtained from oxidation of Ni layer using RTA at 400° C. for 30 seconds in pure $O_2$. The upper layer protects the stack during before FIB cutting.
(b) Selected area electron diffraction pattern and dark field images corresponding to $(111)_{NiO}$ and $(200)_{Ni}$ Bragg spots.

TEM experiments were performed on stacks obtained in various oxidation conditions. For instance, FIGS. 17a and 17b presents the results of TEM experiments performed on sample coated with a 100 nm thick Ni layer, annealed in pure $O_2$ at 400° C. for 30 seconds and covered with a Pt top electrode. A cross-sectional observation shows a stack of several layers with different contrasts (FIG. 17a). In situ x-ray energy dispersive spectrometry (EDS) analysis enabled checking the chemical composition of each film and evidenced a thick Ni-rich layer above Si-rich layer, the upper top layer being Pt. Unfortunately, the EDS detector used was not sensitive to light elements such as oxygen. Consequently, the presence of NiO layer cannot be clearly established from EDS analyses.

To prove the presence of NiO layer, selected area electron diffraction experiments were performed using the smallest available aperture. Although this aperture was still too large to select only one layer, the presence of NiO was confirmed. Indeed, some NiO d-spacings (Powder Diffraction File, PDF no. 47-1049) such as $d_{(111)}$[NiO] differ enough from the d-spacings of the surrounding layers to unambiguously identify the nickel oxide. Using a similar approach with Ni d-spacings (PDF no. 04-0850), the presence of Ni layer was checked. Furthermore, dark field imaging experiments were performed using the diffraction spot corresponding to either $d_{(111)}$[NiO]=2.412 Å or $d_{(200)}$[Ni]=1.762 Å (FIG. 17b). These experiments have then confirmed the presence of NiO layer and have enabled locating both Ni and NiO layers within the stack (FIG. 17a).

As shown on TEM cross-section in FIG. 17a, there is a large spread of NiO thicknesses typically ranging from 40 to 75 nm. The Ni layer is dense and constituted by columnar grains with an average size up to 350 nm parallel to the surface. Micro-diffraction experiments (not shown here) suggested that the Ni layer is preferentially oriented with the [111] crystallographic direction parallel to the substrate's normal, in agreement with the previous x-ray texture analyses. Besides, the Ni/$SiO_2$ interface is flat and clear of defects whereas Pt/NiO and NiO/Ni interfaces are rough and enclose some voids. The NiO layer is constituted of smaller grains as compared to Ni with a maximum size 120 nm.

Figure 18A:
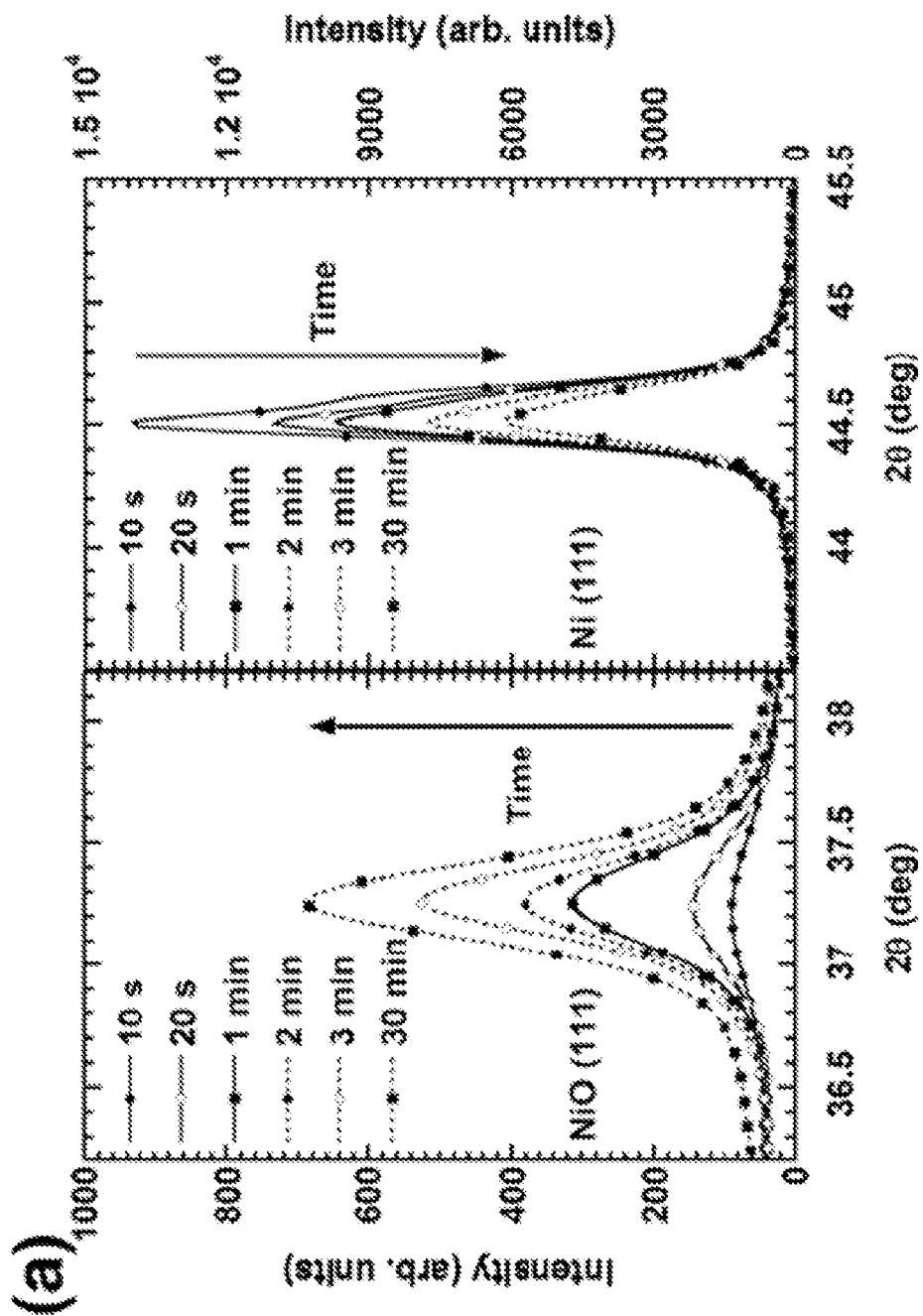
FIGS. 18a-b shows relationship between Ni crystallographic structure and oxidation time according to an embodiment:
(a) Evolution versus oxidation time of $(111)_{NiO}$ (on left) and $(111)_{Ni}$ (on right) Bragg reflections.
(b) Annealing time-dependent evolution of integral breadth β of $(111)_{NiO}$ Bragg reflection and corresponding average size of NiO crystallites.
Figure 18B:
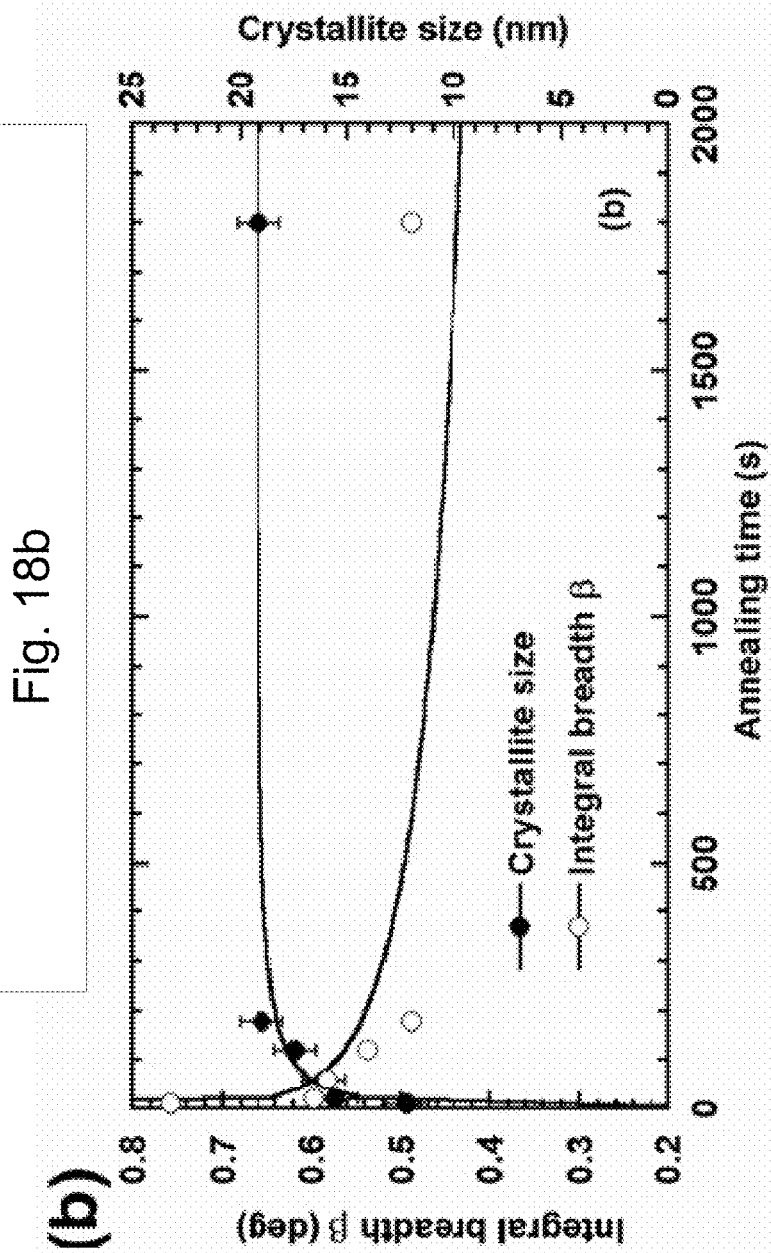

3.2 Oxidation Kinetics of Ni Metallic Layer
3.2.1 Ex Situ X-Ray Diffraction to Apprehend RTA Oxidation A detailed analysis of NiO/Ni stack formation was performed from x-ray diffraction patterns collected on a 100 nm thick Ni film after RTA oxidation at 400° C. in pure $O_2$ with annealing times ranging from 10 seconds to 30 minutes. In FIG. 18a, concomitant diffracted intensity variations of both Ni (decrease) and NiO (increase) phases are observed with increasing oxidation times. This feature indicates that the Ni metallic film is progressively consumed as the NiO film grows. In addition, the peak profiles were individually adjusted using the program Winplotr [14] to extract the time-dependent evolution of integrated intensity and full width at half maximum (FWHM) of both $(111)_{NiO}$ and $(111)_{Ni}$ reflections. The time-dependent variation of the intensities indicates that the initial extremely rapid oxidation is followed by a slower oxidation rate (not shown here). In addition, the integral breadth $\beta$ (linked to FWHM) of the $(111)_{NiO}$ Bragg peak decreases with increasing oxidation time (FIG. 18b). The integral breadth $\beta$ may be interpreted in terms of crystallite size using the Scherrer formulae $\beta=\lambda/(D\times\cos\theta)$, where D is the apparent crystallite size (in the present case, the local strain effect was not taken into account). Consequently, the decrease of $\beta$ is interpreted as a growth of NiO crystallites along with oxidation times (FIG. 18b).

3.2.2. Oxidation Kinetics From In Situ Time-Dependent X-Ray Diffraction

Figure 19B:
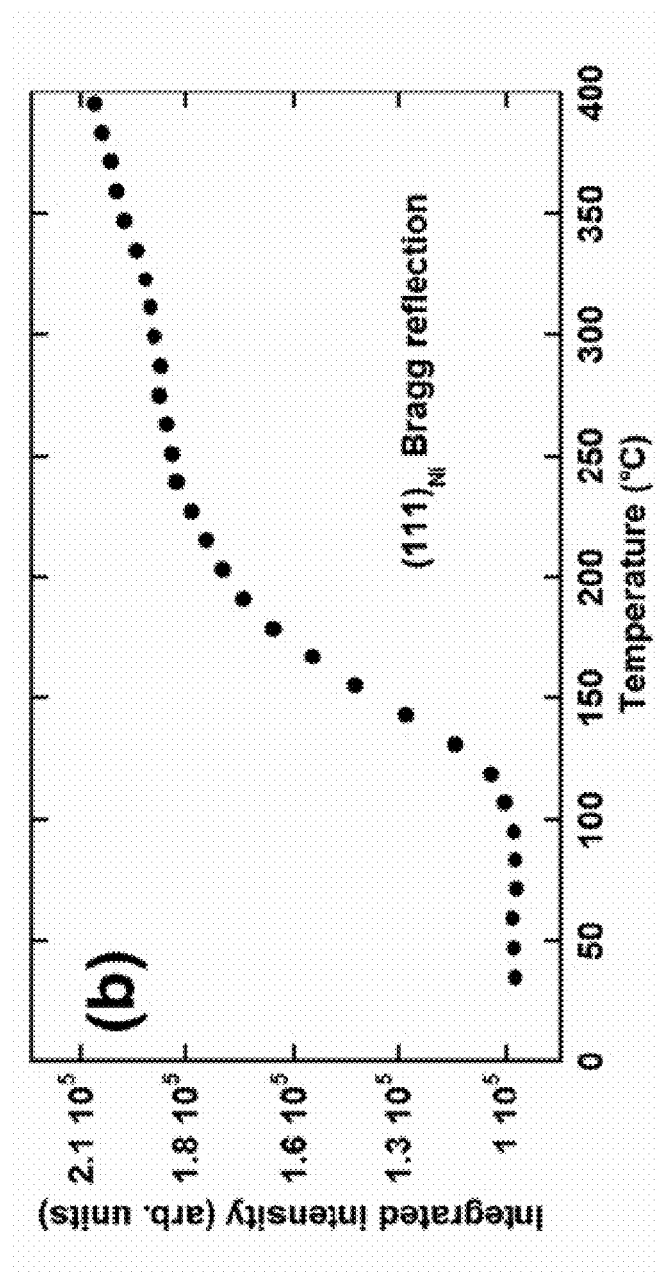
Figure 19C:
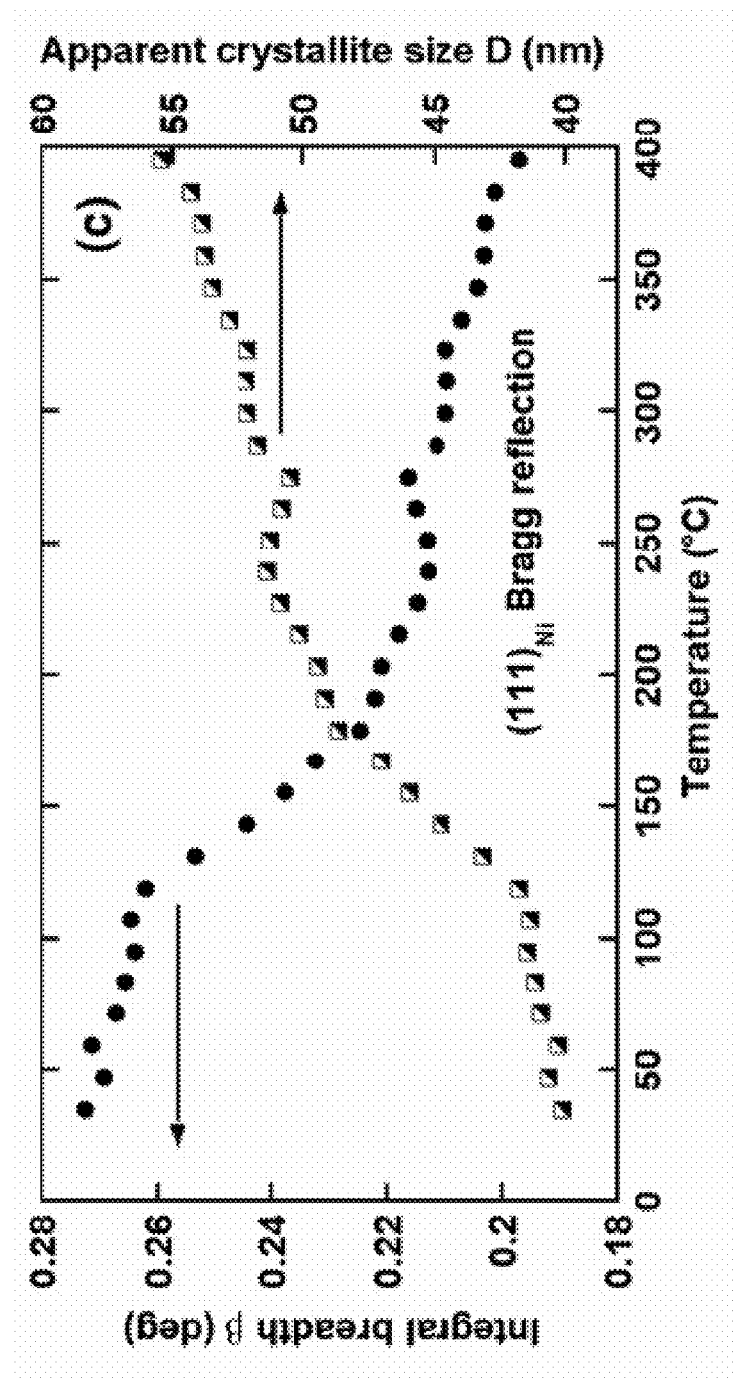

To complement previous ex situ analyses, in situ temperature and time-dependent x-ray diffraction experiments were performed on 100 nm thick Ni films annealed at 400 or 500° C. in pure $O_2$. Before the oxidation step, the Ni metallic films were heated under vacuum in the furnace mounted on the diffractometer and x-ray diffraction patterns were collected from 25° C. to 400 or 500° C. As shown in FIG. 19a, the temperature-dependent evolution of the $(111)_{Ni}$ Bragg reflection exhibits a drastic intensity increase. Using an individual profile fitting procedure, the integrated intensity (FIG. 19b) and integral breadth $\beta$ (FIG. 19c, left) were extracted. Both evolutions indicate a further crystallization of Ni layer during heating and the decrease of $\beta$ above 100° C. may be interpreted as an increase of the average Ni crystallite size (FIG. 19c, right). The same tendency was observed for sample heated up to 500° C.

Figure 20A:
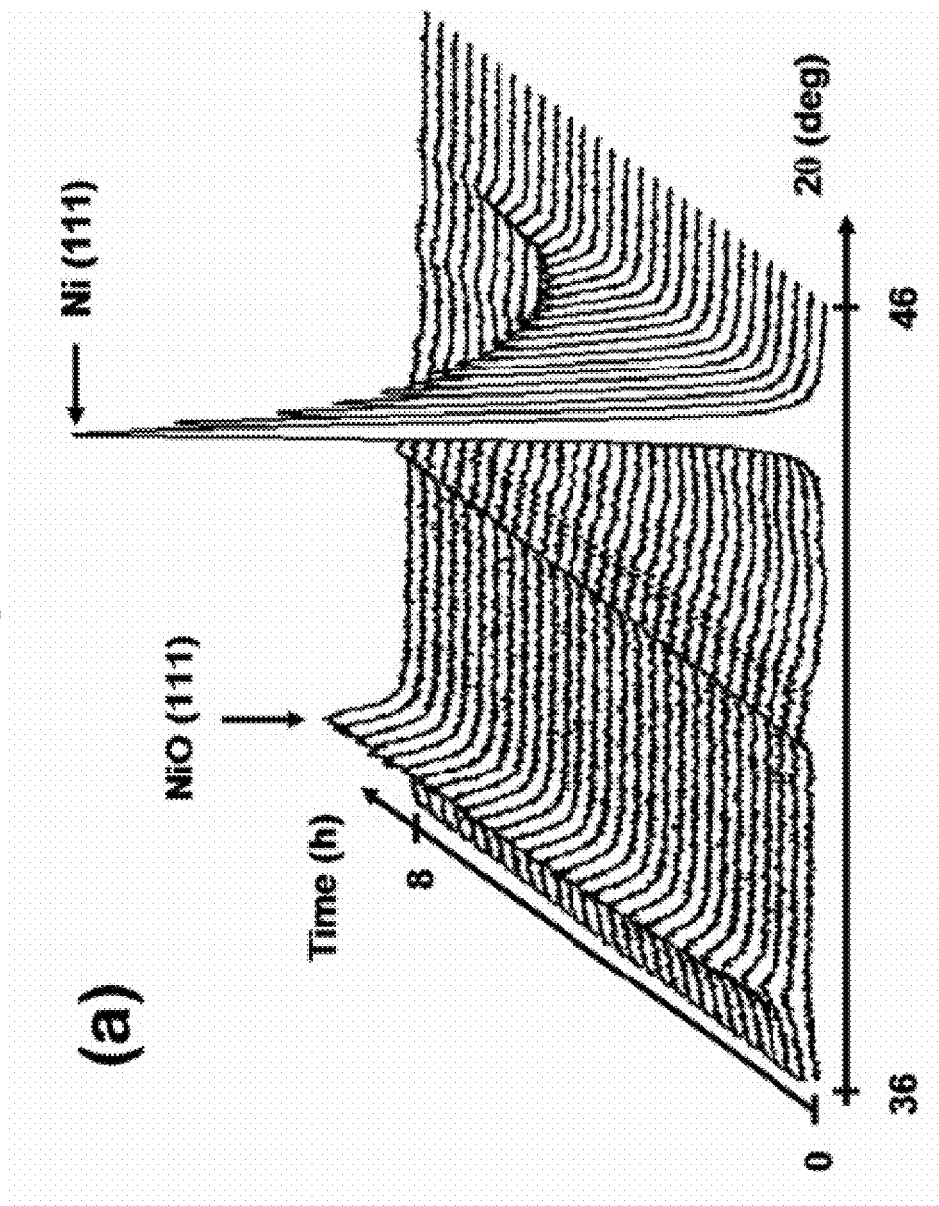
FIGS. 20a-b show relationships between Ni crystallographic structure and annealing temperature according to an embodiment:
(a) Time-dependent evolution of diffraction patterns recorded at isotherm 400° C. in pure $O_2$ and showing concomitant evolutions of $(111)_{Ni}$ and $(111)_{NiO}$ Bragg reflections.
(b) Corresponding evolution of integrated intensities.
Figure 20B:
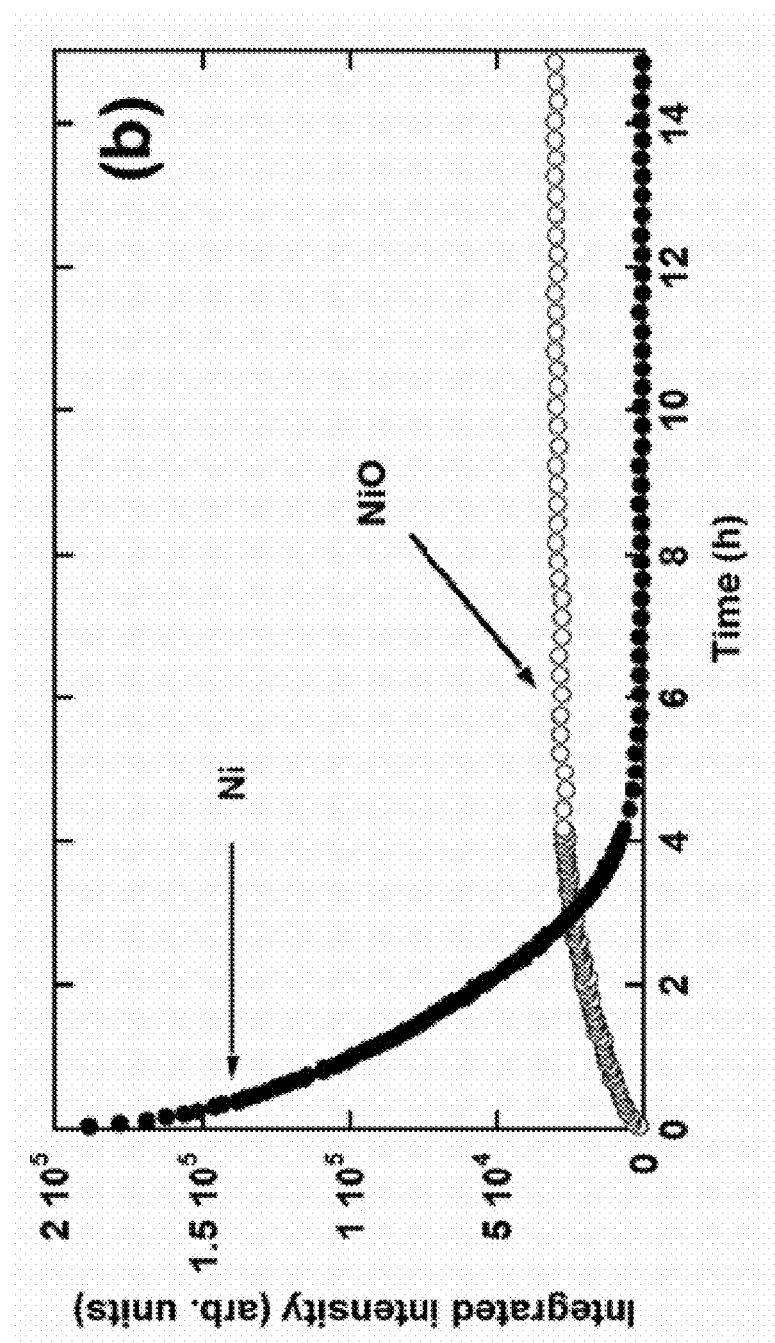
Figure 21A:
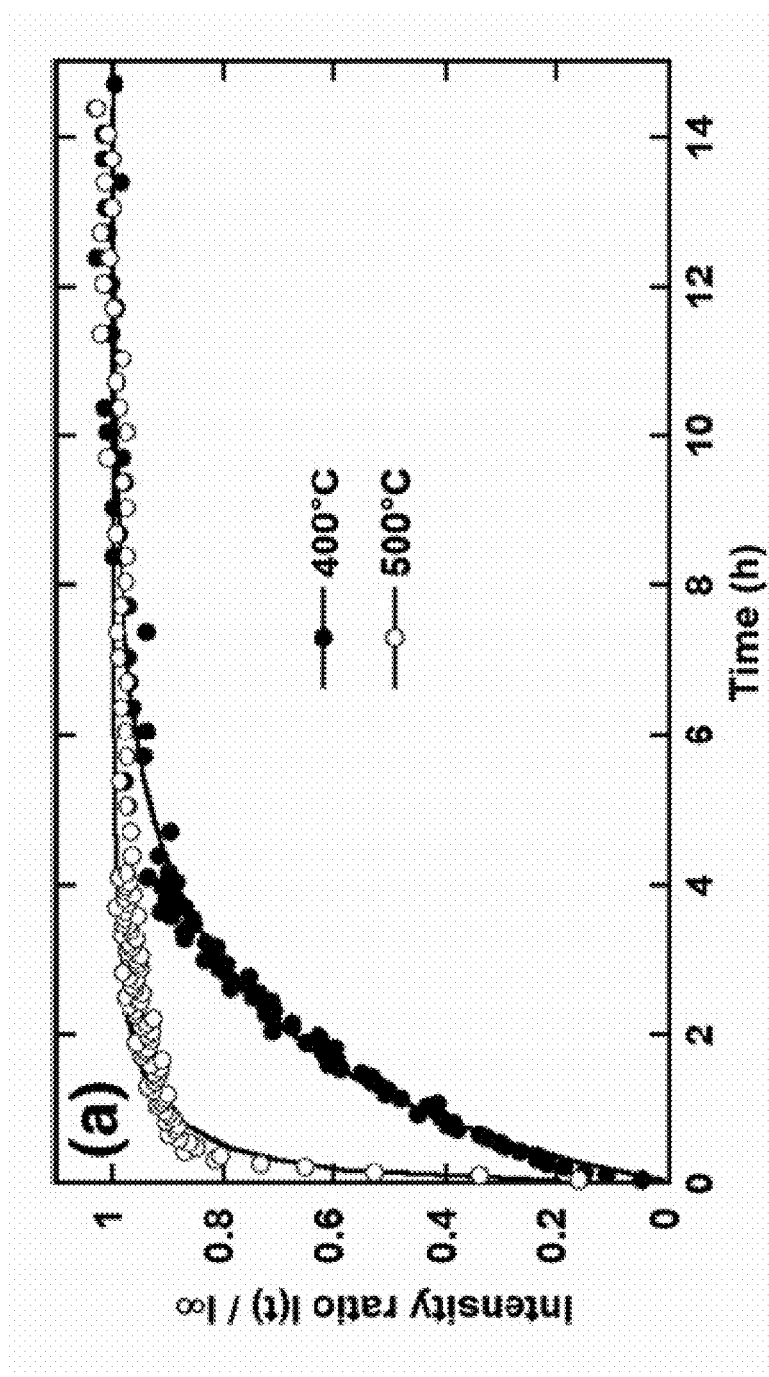
FIGS. 21a-b show relationships between Ni crystallographic structure and oxidation parameters according to an embodiment:
  (a) Evolution versus oxidation time of integrated intensity ratio I(t)/I(t→∞) of $(111)_{NiO}$ Bragg reflection measured at 400 and 500° C.
  (b) Time-dependent growth of NiO apparent crystallite size deduced from the integral breadth β of $(111)_{NiO}$ reflection measured at 400 and 500° C. The solid lines are the curves calculated from the JMAK model (see text for details).
  The inset compares the evolution of NiO crystallite size (t<2 hours) for pre-treated Ni films at 400 and 500° C. and for a Ni layer directly subjected to the oxidizing atmosphere at 400° C.

In a second step, time-dependent x-ray diffraction patterns were collected in pure $O_2$ at constant temperature for 15 hours. The scanned angular range was limited to 36-46° in 2θ, domain that contains the $(111)_{Ni}$ and $(111)_{NiO}$ reflections. Whatever the isotherm, concomitant variation between both Ni and NiO intensities was observed with increasing oxidation times as illustrated in FIG. 20a for isotherm at 400° C. FIG. 20b presents the time-dependent variation at 400° C. of integrated intensity for $(111)_{NiO}$ and $(111)_{Ni}$ Bragg peaks. These evolutions indicate that the Ni metallic film is progressively consumed as the NiO film grows up to the total consumption of the Ni layer. The same kind of evolution was observed at 500° C. with faster oxidation kinetics. FIG. 21a shows the time-dependent variation, at 400 and 500° C., of the $(111)_{NiO}$ integrated intensity ratio $I(t)/I_\infty(t\to\infty)$ between time t and final time ($t\to\infty$) after total Ni consumption. These ratios qualitatively point out that the Ni oxidation rate increases with increasing annealing temperature.

Figure 21B:
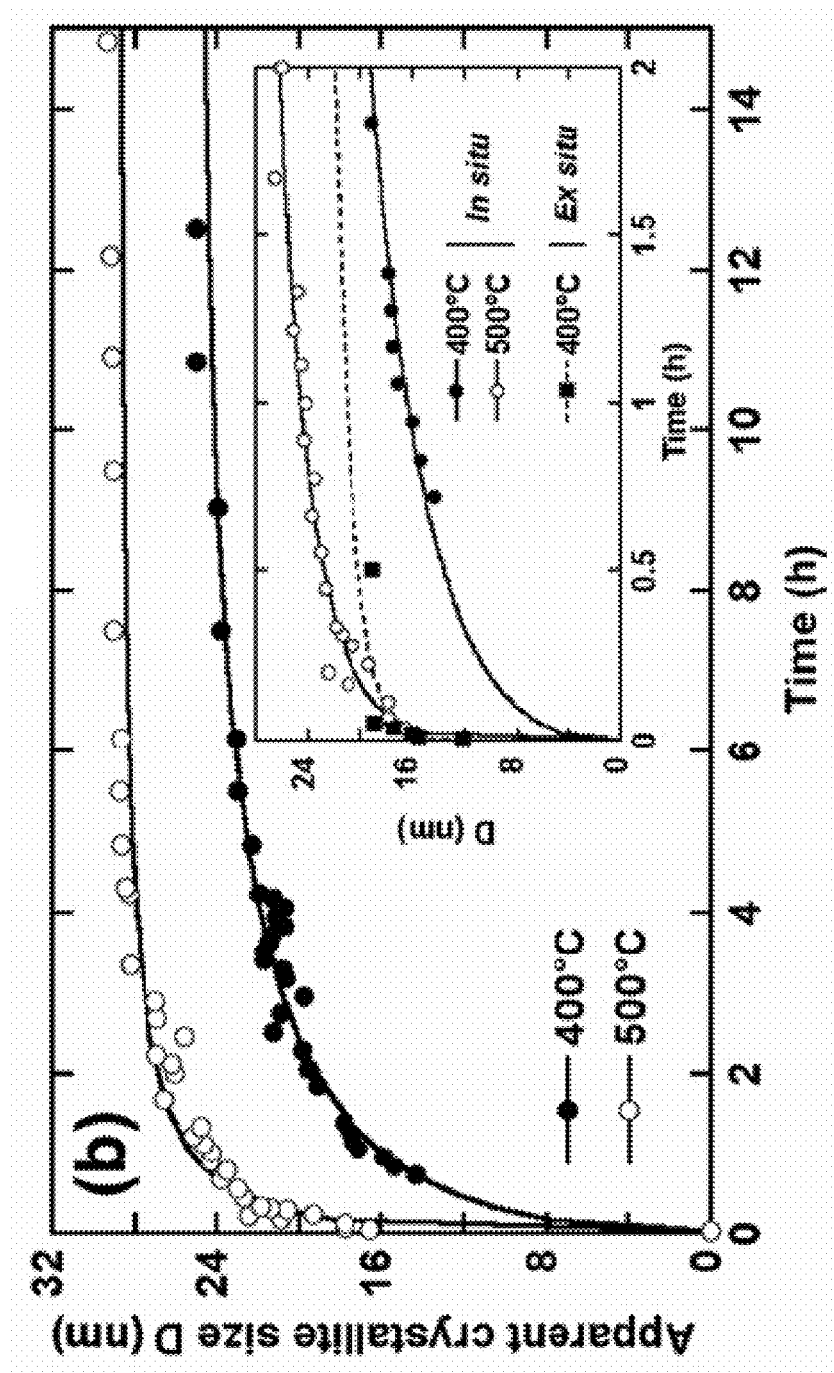

FIG. 21b shows, at 400 and 500° C., the time-dependent increase of NiO average crystallite size D deduced from the decrease of the $(111)_{NiO}$ integral breadth $\beta$. Isothermal nucleation/growth process of particles is usually described by the Johnson-Mehl-Avrami-Kolmogorov (JMAK) theory. This model gives the time-dependent evolution of the volume V(t) of a nucleating and growing phase. In the present case, the evolution in time of NiO crystallite size D has been fitted using a JMAK-type equation: $D(t)=D_\infty[1-\exp(-k \times t^n)]$, where $D_\infty$ corresponds to the final crystallite size when $t \to \infty$. The satisfactory fitting of experimental data shown in FIG. 21b clearly indicates that the growth of NiO crystallites follows the JMAK model. Table 2 (FIG. 27) summarizes the parameters of the JMAK model for each temperature. The parameters n and k are respectively the JMAK coefficient and the growth rate constant depending on temperature. The growth rate constant k is around 0.96 at 400° C. while at 500° C., k equals 1.42. Besides, the crystallite size is also influenced by the temperature: at 400° C., $D_\infty \approx 26$ nm while $D_\infty 32$ nm at 500° C. These results clearly show that growth of NiO crystallites is significantly accelerated at 500° C.

3.2.3. Comparison of RTA and In Situ Oxidation Conditions

Inset in FIG. 21b illustrates the growth of NiO crystallites versus oxidation times (<2 hours) (i) for pre-treated Ni films at 400 or 500° C. (in situ diffraction experiments) and (ii) for a Ni layer directly subjected to the oxidizing atmosphere (ex situ diffraction experiments). At 400° C., the rather different growth rate constants k indicates that the oxidation kinetics is much faster for RTA route (Table 2). The main difference between these two sets of conditions stands in the pre-treatment of Ni metallic layer prior to oxidation. Furthermore, at 400° C. after 30 minutes in pure $O_2$, the crystallite size is about 14 nm when the Ni film is pre-treated under vacuum whereas it is of 21 nm without pre-treatment. Hence, these analyses show that the oxidation kinetics of Ni layer strongly depends on its own microstructure, which is modified by the thermal pre-treatment.

Figure 22:
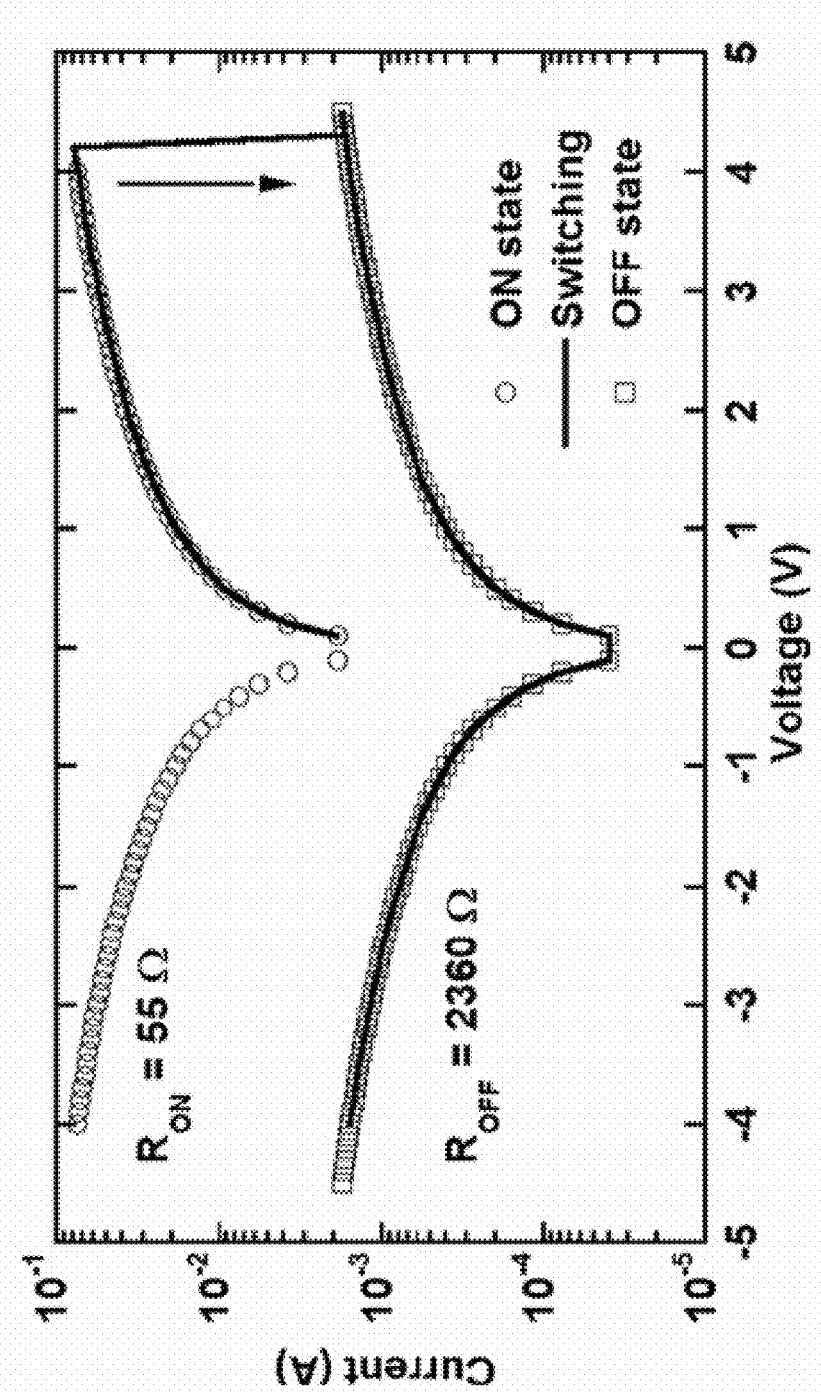
FIG. 22 shows typical I(V) switching characteristics of the Pt/NiO/Ni MRM structures: the NiO film was obtained from oxidation of a 100 nm thick Ni layer using RTA at 400° C. for 10 seconds in pure $O_2$.

4. Electrical Behavior of NiO Films Obtained in Various Conditions 4.1. Typical Switching Characteristic FIG. 22 shows a typical current-voltage I(V) switching characteristic measured with a staircase voltage ramp on a Pt/NiO/Ni stack. The measurements were performed on an initial 100 nm thick Ni layer oxidized in pure $O_2$ using RTA at 400° C. for 10 seconds. For a voltage sweep $0 \to 4V \to 0 \to -4V \to 0$, no switching occurs and the high current response is indicative of the initial low resistance state. As the voltage is ramped up to 4.5 V, the current abruptly decreases at 4.2 V pointing out a resistance switching of the MRM structure from a low ($R_{ON}=55\Omega$) to a high resistance state ($R_{OFF}=2 360\Omega$). In this latter case, the switching was irreversible, the structure remaining in OFF state whatever the bias imposed.

The Pt top electrode area dependence of resistance switching was also studied: in reducing TE diameter from 540 to 160 µm, the current in the low resistance (LRS) state remains quite unchanged whereas a decrease of one order of magnitude is observed in the high resistance state (HRS). These results indicate that the conduction in HRS is strongly dominated by the area of top electrode whereas the formation of filamentary paths in the oxide can be proposed to explain the conduction in LRS. Besides, it has been mentioned in the previous paragraph that the MRM structures systematically turn off around 4.2 V in applying a positive voltage to the bottom electrode with a sweep of 0.2 V/msec. In decreasing the voltage sweep, the current through the structure increases whereas the threshold voltage decreases (e.g. for a sweep of 0.02 V/msec, the switching is observed at 3.7 V). Consequently, the opposite variations of current level and threshold voltage seem to be in favor of a heating Joule effect with a subsequent destruction of filaments in LRS and a switching to HRS.

4.2. Influence of Annealing Time and Temperature Under Pure Oxygen

Figure 23A:
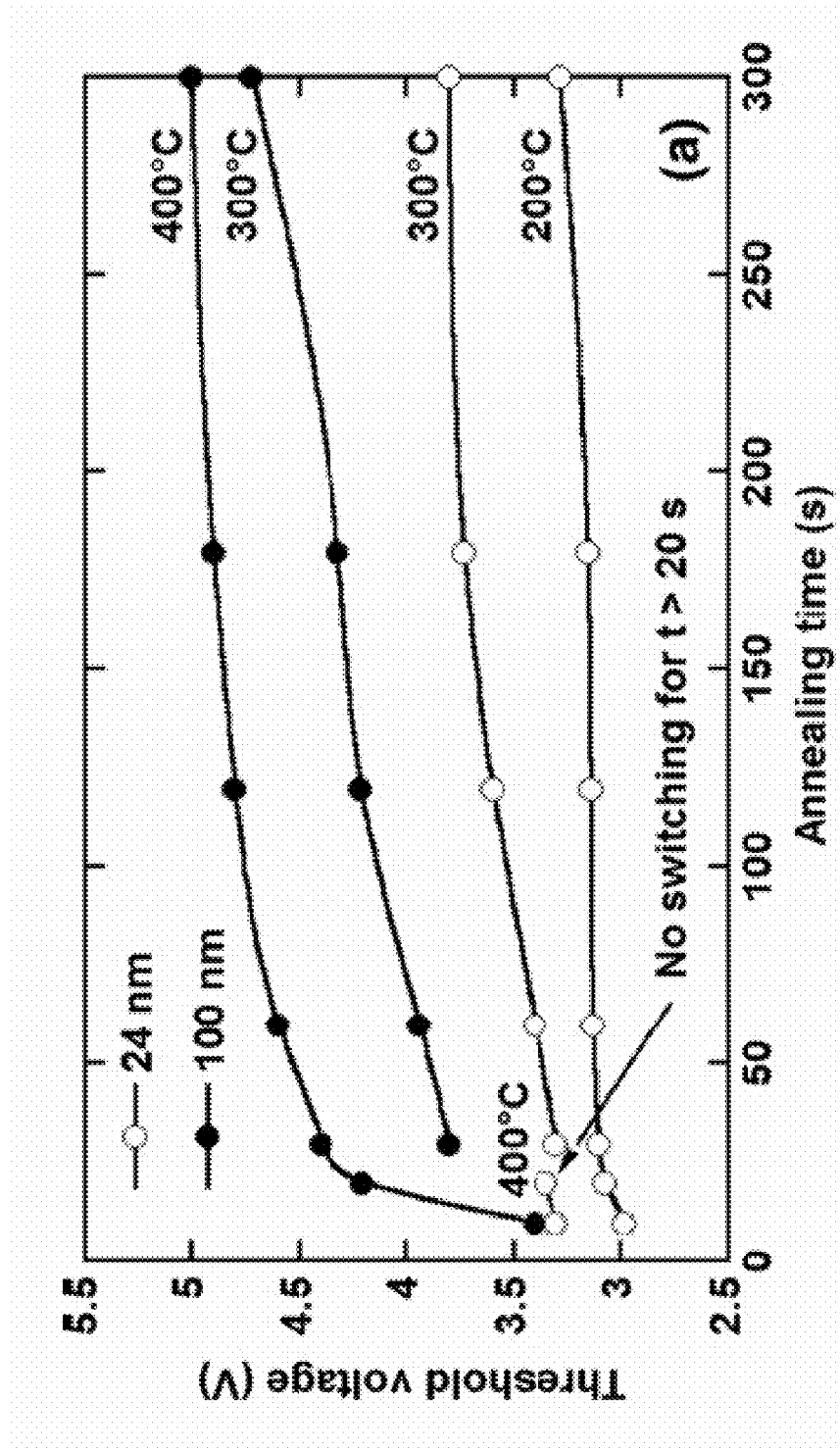
FIGS. 23a-b show evaluation of electrical parameters as function of annealing time according to an embodiment.
  (a) Evolution of threshold voltage ($V_{th}$) as a function of the annealing time for Pt/NiO/Ni MRM structures. I(V) characteristics were measured on samples with initial 24 or 100 nm thick Ni layers, annealed under pure $O_2$ at different temperatures (200, 300 and 400° C.) from 10 to 300 seconds. No switching was observed for 100 nm thick Ni layer annealed at 200° C.
  (b) Typical annealing time-dependent variation of low ($R_{ON}$) and high ($R_{OFF}$) resistances of 24 or 100 nm thick Ni layer oxidized at 300° C. in pure $O_2$.

I(V) measurements were performed on samples coated with a 24 or 100 nm thick Ni layer, oxidized in pure $O_2$ at different temperatures (200, 300 and 400° C.) with RTA times ranging from 10 seconds to 5 minutes. The observed electrical behavior was systematically correlated with ex situ x-ray diffraction patterns enabling detection of Ni and/or NiO phases. FIG. 23a shows that the threshold voltage $V_{th}$ increases along with annealing time whatever the initial thickness of Ni film.

For samples with a 100 nm thick Ni layer, an annealing at 300° C. or above in pure $O_2$ is used to at least partially oxidize the metallic film and to form NiO-based structures exhibiting a resistance switching with threshold voltages ranging from 3.5 to 5 V (Table 3a, FIG. 28). Indeed, the observation of $(111)_{NiO}$ Bragg reflection for RTA at 300 and 400° C. is in agreement with the formation of a bi-stable NiO layer whereas the absence of NiO phase for RTA at 200° C. explains the lack of switching behavior. Moreover, the threshold voltage $V_{th}$ increases along with the annealing temperature: for instance after 180 seconds of oxidation, $V_{th}$ raises from 4.3 V at 300° C. to 5 V at 400° C.

Figure 23B:
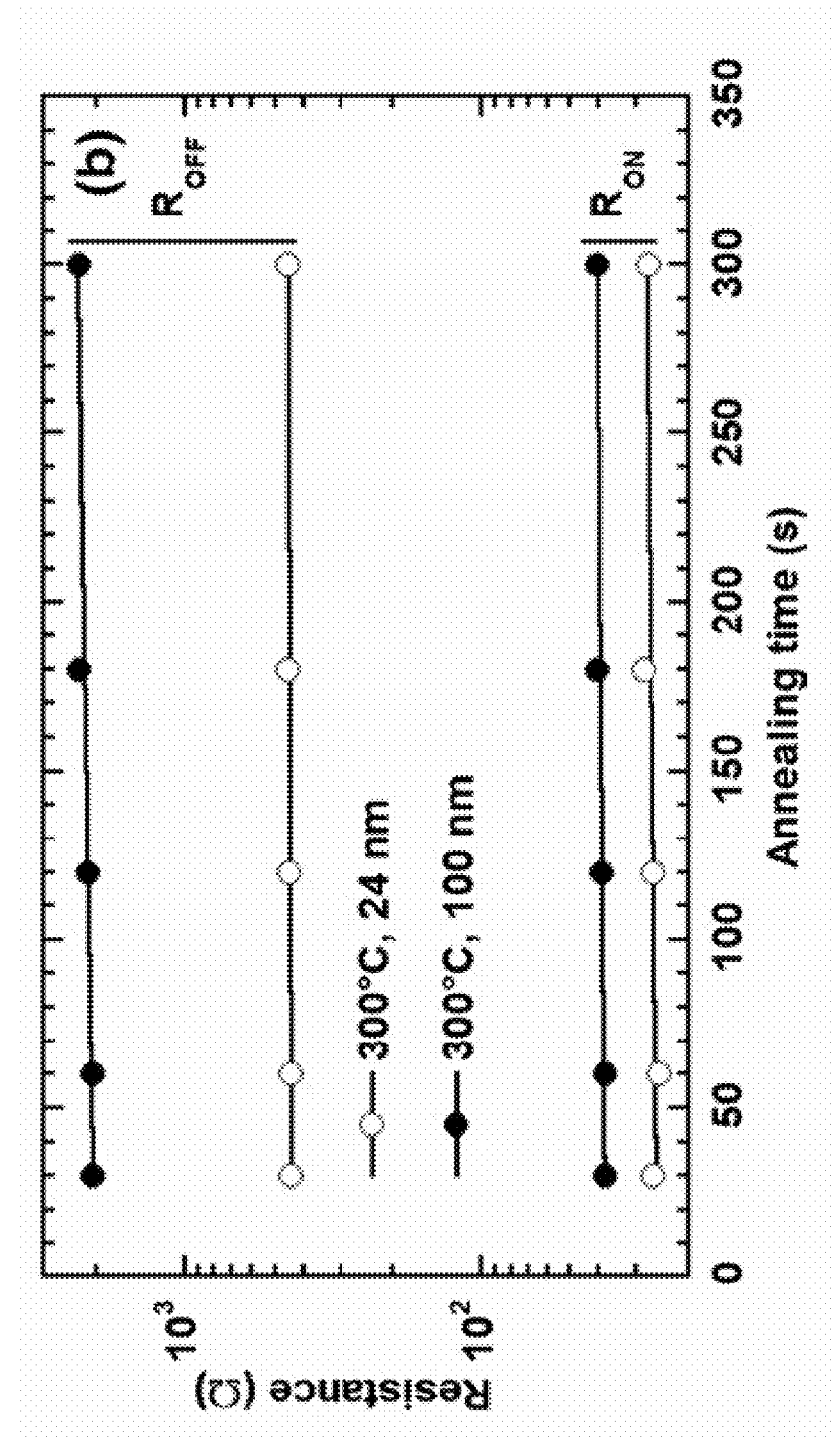

For samples with initial 24 nm thick Ni layer, $V_{th}$ follows the same tendency since it increases along with annealing time and temperature (FIG. 23a). For instance, after 180 seconds of annealing, $V_{th}$ increases from 3.1 V at 200° C. to 3.8 V at 300° C. Furthermore, it is observed that no switching occurs when the Ni films were annealing at 400° C. for times larger than 30 seconds. X-ray diffraction experiments have shown that, in these conditions, the Ni metallic film is fully consumed (with subsequent disappearance of bottom electrode). In this latter case, electrical measurements are impossible. Besides the threshold voltage, the evolution of $R_{ON}$ and $R_{OFF}$ resistances deduced from the slope of I(V) curves measured on samples annealed at 300° C. shows a very slight increase with annealing time although the $R_{OFF}/R_{ON}$ ratio remains quite unchanged (FIG. 23b). The average $R_{OFF}/R_{ON}$ ratio is around 55 for samples with an initial 100 nm thick Ni layer annealed at 300° C., whereas it is only around 15 for samples with 24 nm thick Ni layer. Therefore, in the perspective of memory devices, 100 nm thick Ni layers provide a large memory window enabling a better discrimination between ON and OFF states. In contrast, the lower threshold voltages measured on 24 nm thick Ni layers oxidized at moderate temperature with short annealing times would match the low-voltage application requirements.

4.3. Influence of Oxidizing Atmosphere

Figure 24:
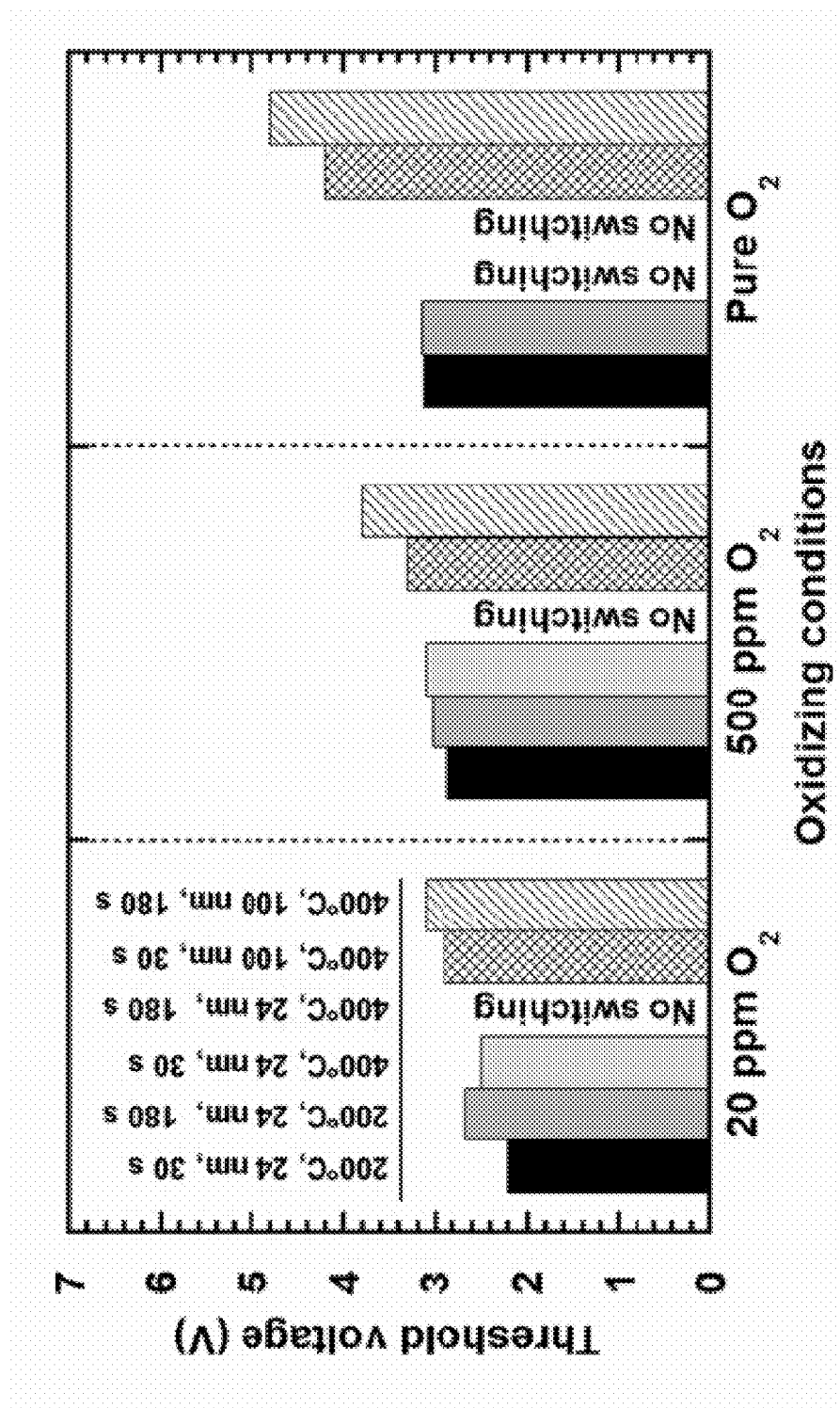
FIG. 24 shows the distribution of threshold voltages ($V_{th}$) for Pt/NiO/Ni MRM structures produced under different oxidizing atmospheres (RTA at 200 and 400° C. for 30 and 180 seconds) according to an embodiment.

Different oxidizing atmospheres (20 and 500 ppm of $O_2$; pure $O_2$) were tested on samples coated with initial 24 or 100 nm thick Ni layer and annealed using RTA at 200 and 400° C. for 30 seconds and 3 minutes. Once again I(V) characteristics were systematically correlated with x-ray diffraction patterns. FIG. 24 presents the distribution of threshold voltages $V_{th}$ measured in different experimental conditions. The main trend is the augmentation of $V_{th}$ with increasing oxygen partial pressure: $V_{th}$ varies from 2.2 V (24 nm thick Ni layer annealed at 200° C. for 30 seconds under 20 ppm of $O_2$) to 5 V (100 nm thick Ni layer annealed at 400° C. for 180 seconds in pure $O_2$). It is worth noting that in few cases no switching was observed for 24 nm thick Ni layers (Table 3b, FIG. 28). For instance at 400° C., whatever the oxygen partial pressure, the annealing time should be limited to 30 seconds to prevent the total oxidation of Ni layer (checked by x-ray diffraction). In contrast, for lower temperatures (e.g. 200 and 300° C.), the Ni layer is only partially oxidized whatever the annealing time and oxygen partial pressure and a switching is observed.

As partial conclusion, FIG. 24 helps to establish the experimental conditions under which bi-stable NiO films are formed with switching voltages that may be easily tailored by monitoring annealing time and/or $O_2$ partial pressure.

5. Discussion

In this section, both microstructural and electrical characteristics of Pt/NiO/Ni MRM structures are discussed in correlation with the experimental conditions. Tables 2a and 2b gather the experimental conditions, the presence of Ni and/or NiO layers (detected by x-ray diffraction) and the threshold voltage of the MRM structures when switching was observed.

5.1. Impact of Ni Microstructure on Oxidation Kinetics

Electrical testing presented in previous section revealed major differences in the switching behavior which may be linked to the Ni microstructure before oxidation step. Indeed, a resistive switching occurs on a 24 nm Ni layer oxidized at 200° C. whereas it is not observed on a 100 nm Ni film annealed in the same conditions (cf. Tables 2a and 2b). This peculiar behavior may find its origin in the thickness-dependent microstructure of Ni layer which influences the oxidation kinetics. As shown in FIG. 16a, the 24 nm thick Ni layer presents much smaller crystallites and a lower texture along $[111]_{Ni}$ direction as compared to the 100 nm thick Ni layer. Consequently, the growth kinetics of NiO film seems to depend on the texture and crystallite size of the initial Ni metallic layer. Several arguments may support this hypothesis:

Firstly, x-ray texture analyses (FIG. 16d) showed a fiber texture of NiO film along the [111] direction (cf. section 3.1.). This result is in good agreement with the work of Czerwinski et al. which showed that the stronger the $[111]_{Ni}$ substrate texture, the stronger the $[111]_{NiO}$ oxidized layer texture became after oxidation. In contrast, López-Beltrán et al. obtained texture-free polycrystalline NiO layer from the oxidation of a weakly textured Ni film.

Second, concerning the Ni film texture, Czerwinski et al. and Peraldi et al. have demonstrated the important role of crystallographic orientation of nickel on its oxidation kinetics. Hence, a strong [111] texture of Ni leads to formation of highly protective and slow growing NiO film, i.e. a weaker Ni texture significantly decreases the resistance to the oxidation.

Finally, Graham et al. demonstrated that the oxidation rate is strongly dependent on the Ni surface morphology. Moreover, at lower temperatures, the influence of oxygen transport increases through short circuit paths, such as grain boundaries and dislocations. As a result, smaller Ni crystallites result in a larger amount of grain boundaries which may facilitate the oxygen diffusion and accelerate the NiO formation.

Consequently, the non-oxidation of 100 nm thick Ni film at 200° C. (with subsequent lack of switching) may find its origin (i) in a stronger $[111]_{Ni}$ texture that increases the resistance to oxidation and (ii) in larger crystallites that decrease the amount of grain boundaries and limit oxygen diffusion.

Besides, as seen in inset of FIG. 21b, the comparison of time-dependent growth of NiO crystallites (extracted from ex situ and in situ x-ray diffraction experiments) confirms again the influence of Ni microstructure on the NiO growth. When the Ni metallic film is annealed under vacuum prior to oxidation, a further crystallization occurs with an enhancement of $[111]_{Ni}$ texture and a growth of Ni crystallites (cf. FIGS. 4b and 4c). In contrast, the RTA conditions lead to a rather different situation with two competitive mechanisms that simultaneously occur: Ni crystallization with subsequent changes in the microstructure; growth of NiO film with progressive consumption of the Ni layer. Thus, the different "history" of Ni layer before oxidation may explain the faster kinetics (cf. Table 1) observed in RTA conditions in which metallic layer is directly subjected to the oxidizing atmosphere without pre-treatment.

To conclude, in agreement with previous published works, the Ni surface morphology and its thermal treatment prior to the oxidation radically change the growth kinetics of the NiO film. Consequently, the present experiments emphasize the importance of thermal pre-treatment in order to avoid the competition between Ni crystallization and oxidation.

5.2. Initial ON State

As compared to sputtered films reported in literature, the NiO films obtained from Ni oxidation are initially in ON state without special electro-forming generally used to reach the conductive state. Oxygen content in oxide films may explain such a behavior. Varying oxygen content in sputtering gas mixture, several authors have shown a drastic modification of the electrical properties of $Ni_xO$ films from a metallic behavior (highly Ni-excess films) at low oxygen content (<5% of oxygen in sputtering gas) to a monostable threshold switching (Ni-deficient films) at high oxygen content (>20%), the memory switching region being limited to intermediate oxygen contents (10-17%) [27,28]. The comparison of the cubic cell parameter of films obtained in pure oxygen (a=4.18 Å) with those of Ni-deficient (a=4.23 Å) and Ni-excess (a=4.17 Å) films suggests that nickel oxide films obtained from Ni oxidation are close to the Ni-excess region within memory switching area. Moreover, the vicinity of the metallic behavior region may certainly explain the initial conductive state.

5.3. Irreversible Switching

On the basis of the previous discussion, one could expect a reversible switching of NiO-based structures. On the contrary the MRM structures remained in the OFF state after the first and unique switching. This irreversibility certainly originates in the roughness of NiO/Ni and Pt/NiO interfaces seen on TEM cross-section images (FIG. 17a). Indeed, the TEM observations have revealed that the Ni metal surface is covered by a continuous but irregular oxide layer with thicknesses ranging from 40 to 75 nm. This latter characteristic may have a crucial role on the reversibility of switching since several authors have attributed the switching to the formation/rupture of conductive paths near the interface. During oxidation, the growth of the NiO oxide film is rather non-uniform as a consequence of different growth rates for different Ni grain orientations. Indeed, Peraldi et al. have demonstrated the important role of the crystallographic orientation of nickel on the oxidation kinetics. For instance, oxidation of the (100) nickel face is more rapid than oxidation of (110), (111), and (112) faces. Once again, it appears crucial to stabilize the Ni film microstructure before oxidation step in order to decrease the roughness of the NiO film.

Finally, in previous works, Haugsrud mentioned the existence of microfissures within the NiO oxide obtained from Ni oxidation at high temperatures. Several main routes were suggested to account for the presence of microfissures. Based on these results, one can propose the existence of such microfissures within the NiO film which may explain the difficulty to re-form the conductive paths after switching. These microfissures may also lead to a partial delamination at the interface between Ni and NiO films, such a delamination being sometimes observed during TEM cross-section sample preparation by mechanical polishing (Tripod technique).

6. Conclusion

In this paper, the oxidation kinetics of Ni metallic films were apprehended in order to form NiO layers exhibiting a voltage-induced resistive switching within Pt/NiO/Ni MRM structures. Process parameters (temperature, annealing time and oxidizing atmosphere) of Rapid Thermal Annealing route were tested to achieve oxidation. Different thermal treatments were selected to oxidize the metallic film with conditions (i) preventing the complete consumption of Ni film used as bottom electrode and (ii) producing bi-stable oxide films. With these experimental conditions, the as-grown NiO films were initially in the low resistance ON state without special electro-forming usually used for sputtered NiO films. The obtaining of Ni-excess oxide films may explain the initial metallic behavior. Nevertheless, above a threshold voltage, varying from 2 to 5 V depending on the oxidizing conditions, the MRM structures irreversibly switched into a high resistance OFF state. This irreversibility may be linked to the roughness of NiO/Ni and Pt/NiO interfaces due to a non-stabilized Ni film microstructure prior to oxidation.

Currently, new experimental conditions are evaluated in order to control the Ni crystallization prior to oxidation and alternative routes for Ni oxidation such as plasma treatment under $N_2O$ or $O_2$ is explored. Finally, fully integrated bi-stable NiO/Ni stacks in via structures will be fabricated and the stability of the MRM structures in conditions close to those used in the back-end process will be checked.

Figure 25:
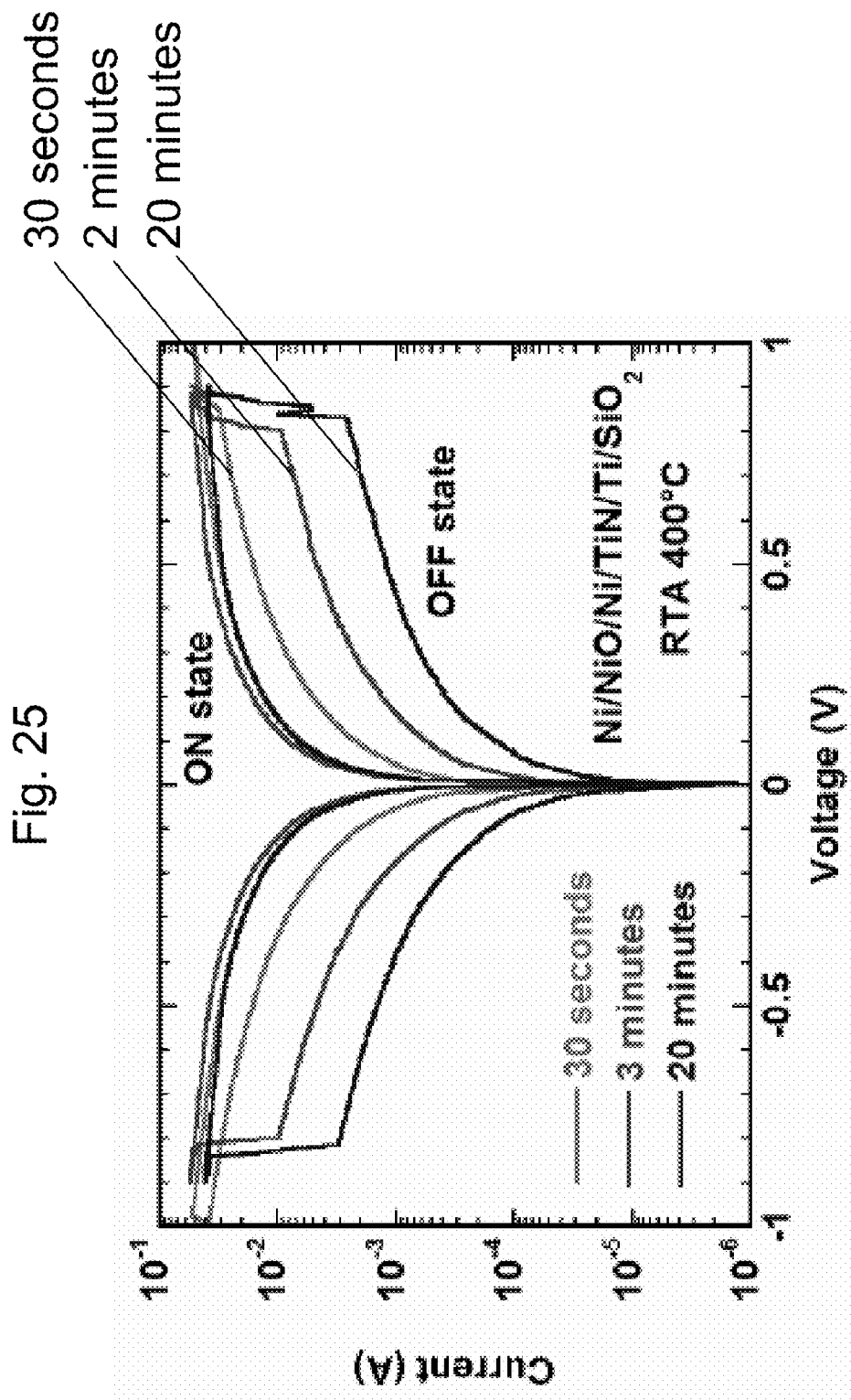
FIG. 25 illustrates the electrical performance of memory devices according to embodiments.

FIG. 25 illustrates the electrical performance of memory devices manufactured according to embodiments. A symmetrical Ni/NiO/Ni/TiN/Ti/SiO$_2$/Si$_3$N$_4$/Si stack was formed whereby an additional TiN/Ti layer stack is inserted between the Ni bottom electrode layer and the underlying substrate. As shown in this FIG. 25 reversible and repetitive bi-stable resistive switching with set and reset voltages below 1V is obtained. The discrimination between the ON and OFF states is improved by increasing the oxidation time (30 seconds, 3 minutes or 20 minutes for RTA at 400° C. in pure $O_2$).

The invention claimed is:

1. A resistivity-switching non-volatile memory element, comprising a resistivity-switching metal-oxide layer sandwiched between a top electrode and a bottom electrode, the layer having a thickness between the top and bottom electrode, the resistivity-switching metal-oxide layer having a gradient of oxygen over the thickness of the layer.

2. A memory element of claim 1, wherein the memory element has set and reset voltages of opposite polarity.

3. A memory element of claim 2, wherein the oxygen gradient decreases from the top electrode towards the bottom electrode.

4. A memory element of claim 1, wherein the metal-oxide comprises nickel.

5. A memory element of claim 4, wherein the metal-oxide is a binary nickel-oxide.

6. A memory element of claim 4, wherein the bottom electrode comprises nickel.

7. A memory element of claim 4, wherein the top electrode comprises nickel.

8. A memory element of claim 4, wherein the bottom electrode comprises: a nickel-containing layer adjacent to a nickel-oxide layer, and a titanium-containing layer adjacent to the nickel-containing layer.

9. A memory element of claim 8, wherein the bottom electrode is a stack of:
a nickel layer adjacent to the nickel-oxide layer;
a titanium-nitride layer adjacent to the nickel layer; and
a titanium layer adjacent to a titanium-nitride layer.

10. A memory element of claim 1, wherein the top electrode and the bottom electrode are formed of the same material.

11. A memory element according to of claim 1, further comprising a selection element in electrical contact with one of the electrodes, wherein the memory element and the selection element are components of a memory cell.

12. A memory cell of claim 11, wherein the selection element is a metal-oxide-semiconductor field-effect transistor (MOSFET) having source and drain junctions, and wherein one of the source and drain junctions of the MOSFET is electrically connected to one of the electrodes.

13. A method for forming a resistivity-switching non-volatile memory element, comprising:
providing a substrate;
forming a bottom electrode on the substrate;
forming a resistivity-switching metal-oxide layer on the bottom electrode, the metal-oxide layer having an oxygen gradient over the layer thickness; and
forming a top electrode on the metal-oxide layer.

14. A method according to claim 13, wherein the memory element has set and reset voltages of opposite polarity.

15. A method according to claim 13, wherein forming the bottom electrode, the metal-oxide layer and the top electrode comprises:
forming a stack of one or more bottom electrode layers, the metal-oxide layer and one or more top electrode layers; and
patterning this stack to thereby form the memory element.

16. A method according to claim 13, wherein:
forming the bottom electrode comprises forming a layer of a metal, and forming the metal-oxide layer comprises converting only an upper part of the metal layer into the metal-oxide layer.

17. A method according to claim 16, wherein the metal is nickel.

18. A method according to claim 17, wherein the metal-oxide is a binary nickel-oxide.

19. A method according to claim 17, wherein forming the top electrode comprises forming a layer of nickel on the nickel-oxide layer.

20. A method according to claim 16, wherein converting the metal layer comprises thermally oxidizing the metal layer.

21. A method according to claim 20, further comprising determining process parameters of the thermal oxidation process in view of the desired electrical characteristics of the memory element, wherein the process parameters are selected from the group consisting of: oxygen partial pressure, oxidation time, and oxidation temperature.

22. A method according to claim 21, wherein the electrical characteristics are the set and reset voltages.

23. A method according to claim 16, further comprising heating the metal layer in a substantially oxygen-free ambient prior to the step of converting an upper part thereof into the metal-oxide layer.

24. A method according to claim 17, wherein the bottom electrode comprises a nickel-containing layer adjacent to the metal-oxide layer, and a titanium-containing layer adjacent to the nickel-containing layer.

25. A method according to claim 24, wherein the titanium-containing layer is formed as a stack of a titanium-nitride layer adjacent to the upper metal layer, and a titanium-layer adjacent to titanium-nitride layer.

26. A method of forming a resistivity-switching non-volatile memory element that includes (i) a bottom electrode having an upper layer of metal, (ii) a resistivity-switching metal-oxide layer with an oxygen gradient over its layer thickness, the layer being formed by thermal oxidation of a part of the upper metal layer, and (iii) a top electrode formed on the metal-oxide layer, the method comprising:
identifying predetermined electrical characteristics desired in a memory element;

determining the oxygen gradient to form in the metal-oxide layer as a function of the desired electrical characteristics of the memory element; and performing an oxidation step to form the determined oxygen gradient over the layer thickness of the resistivity-switching metal-oxide layer.

27. A method according to claim 26, wherein the electrical characteristics are set and reset voltages.

28. A method according to claim 26, wherein the oxidation step is a thermal oxidation step, and wherein determining the oxygen gradient comprises determining the values of process parameters of the thermal oxidation step, wherein these process parameters are selected from the group consisting of oxygen partial pressure, oxidation time, and oxidation temperature.

29. A method according to claim 28, wherein determining the oxygen gradient further comprises selecting the thickness of the metal layer to be thermally oxidized.

30. A method according to claim 29, wherein determining the oxygen gradient further comprises modulating the oxidation kinetics of the metal layer to be thermally oxidized.

31. A method according to claim 30, wherein modulating the oxidation kinetics comprises heating the metal layer in a substantially oxygen-free ambient prior to the step of thermally oxidizing the metal layer, thereby recrystallizing the metal layer.

32. The method according to claim 26, wherein the metal is nickel.

33. The method according to claim 32, wherein the metal-oxide is a binary nickel-oxide.

34. The method according to claim 32, wherein the bottom electrode further comprises a titanium-containing layer underneath the upper metal layer.

35. The method according to claim 34, wherein the titanium-containing layer is formed as a stack of: a titanium-nitride layer adjacent to the upper metal layer, and a titanium-layer adjacent to titanium-nitride layer.

36. A resistivity-switching non-volatile memory element, comprising:
a bottom electrode;
a partially-oxidized metallic film formed on top of the bottom electrode, wherein the oxidized portion of the partially-oxidized metallic film forms a resistivity-switching metal-oxide layer on top of the metallic film; and
a top electrode, wherein the a partially-oxidized metallic film has a gradient of oxygen over a thickness of the film between the top and bottom electrodes.

37. A method for forming a resistivity-switching non-volatile memory element, comprising:
providing a substrate;
forming a bottom electrode on the substrate;
forming a metallic film on the bottom electrode;
at least partially oxidizing the metallic film, thereby forming a resistivity-switching metal-oxide layer having an oxygen gradient over a thickness of the layer; and
forming a top electrode on the metal-oxide layer.

38. A method according to claim 37, wherein at least partially oxidizing the metallic film comprises thermally oxidizing the metallic film.

39. A method according to claim 37, further comprising heating the metallic film in a substantially oxygen-free ambient prior to the step of thermally oxidizing the metallic film.

40. A method of forming a resistivity-switching non-volatile memory element that includes (i) a bottom electrode, (ii) a partially-oxidized metallic film formed on top of the bottom electrode, wherein the oxidized portion of the partially-oxidized metallic film forms a resistivity-switching metal-oxide layer on top of the metallic film, the metallic film having an oxygen gradient over its layer thickness, and (iii) a top electrode formed on the metal-oxide layer, the method comprising:
identifying predetermined electrical characteristics desired in a memory element;
determining the oxygen gradient to form in the partially-oxidized metallic film as a function of the desired electrical characteristics of the memory element; and
performing an oxidation step to form the determined oxygen gradient over the layer thickness of the partially-oxidized metallic film.

41. A method according to claim 40, wherein the oxidation step is a thermal oxidation step.

42. A method according to claim 41, further comprising heating the metallic film in a substantially oxygen-free ambient prior to the thermal oxidation step, thereby recrystallizing the metallic film.

* * * * *